United States Patent
Ulrich et al.

(10) Patent No.: US 9,763,351 B1
(45) Date of Patent: Sep. 12, 2017

(12) United States Patent

(54) LOW COST CARD CARRIER FOR VERTICAL INSERTION OF A COMPUTER CARD IN AN ENCLOSURE

(71) Applicant: Oracle International Corporation, Redwood City, CA (US)

(72) Inventors: Sean Kenneth Ulrich, El Cajon, CA (US); Eric Munro Innes, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/406,105

(22) Filed: Jan. 13, 2017

(51) Int. Cl.
| | |
|---|---|
| H01R 12/00 | (2006.01) |
| H05K 7/14 | (2006.01) |
| H01R 12/70 | (2011.01) |
| H01R 12/72 | (2011.01) |

(52) U.S. Cl.
CPC ....... *H05K 7/1429* (2013.01); *H01R 12/7005* (2013.01); *H01R 12/721* (2013.01); *H05K 7/1461* (2013.01)

(58) Field of Classification Search
CPC .............. H01R 12/7005; H01R 13/629; H01R 13/62905
USPC .......................................... 439/64, 376, 377
See application file for complete search history.

(56) References Cited

U.S. PATENT DOCUMENTS

| | | | | |
|---|---|---|---|---|
| 5,269,698 A * | 12/1993 | Singer | ................. | G11B 25/043 361/679.33 |
| 5,868,585 A * | 2/1999 | Barthel | ................... | G06F 1/184 439/342 |
| 6,115,258 A * | 9/2000 | Hoyle, Jr. | ............ | H05K 7/1409 211/41.17 |
| 6,288,911 B1 * | 9/2001 | Aoki | .................... | H05K 7/1409 211/41.17 |
| 6,315,586 B1 * | 11/2001 | Joyce | ...................... | G06F 1/184 439/157 |
| 6,698,937 B2 * | 3/2004 | Grimes | ................ | G02B 6/3825 385/53 |
| 7,215,556 B2 * | 5/2007 | Wrycraft | .............. | H05K 7/1409 361/741 |
| 7,364,447 B1 * | 4/2008 | Desrosiers | ............. | G06F 1/186 439/157 |

(Continued)

*Primary Examiner* — Phuong Dinh
(74) *Attorney, Agent, or Firm* — Marsh Fischmann & Breyfogle LLP; Kent A. Lembke

(57) ABSTRACT

A computing apparatus adapted for rear access installation of a computer card with blind mating. The apparatus includes an enclosure with a rear access opening and a circuit board mounted in an interior space of the enclosure with an upward facing connector. The apparatus includes a guide assembly comprising a guide mounted within the interior space, and the guide includes a travel surface extending over the upward facing connector of the circuit board. The apparatus includes a card carrier with a frame that houses a computer card, e.g., a PCIe card, which includes a connector extending outward from the card carrier frame. The card carrier rides upon the travel surface when the card carrier is inserted into the enclosure and then pivots about a contact surface in the guide assembly when the computer card connector is proximate to the upward facing connector to provide vertical insertion of the computer card.

20 Claims, 19 Drawing Sheets

(56) References Cited

U.S. PATENT DOCUMENTS

| | | | |
|---|---|---|---|
| 7,420,816 B2* | 9/2008 | Rubenstein | H05K 7/1461 361/727 |
| 8,009,440 B2* | 8/2011 | Desrosiers | H05K 7/1402 361/737 |
| 9,373,914 B2* | 6/2016 | Li | |

* cited by examiner

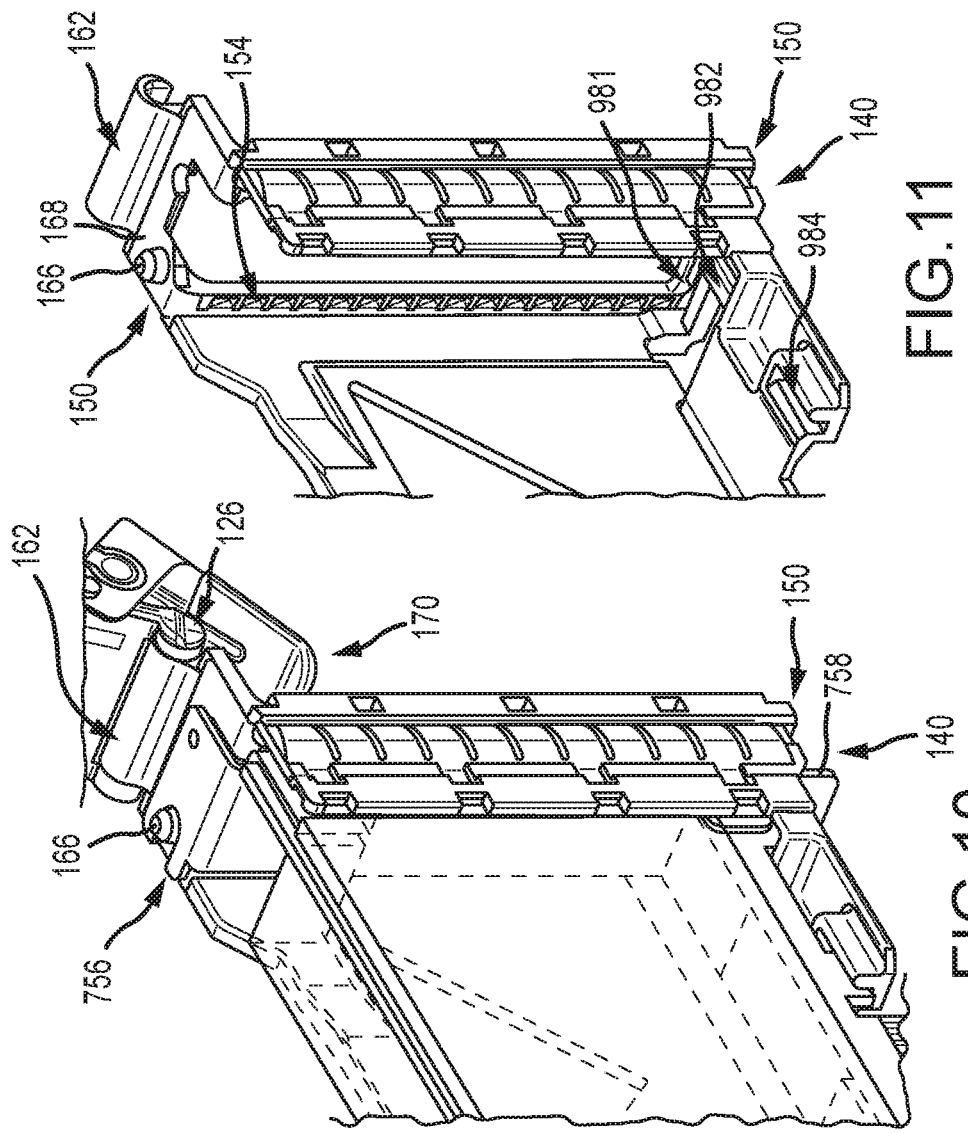

LOW COST CARD CARRIER FOR VERTICAL INSERTION OF A COMPUTER CARD IN AN ENCLOSURE

BACKGROUND

1. Field of the Invention

The present invention generally relates to mounting a computer card, such as a peripheral component interconnect express (PCIe) card, in a computer or other electronic chassis, box, or body (simply called an "enclosure" herein) that may be mounted in a rack with other enclosures/boxes (i.e., each being a rack-mountable chassis) such that top access to the interior of the enclosure is not available, and, more particularly, to a card carrier for housing or carrying a computer card. The card carrier is adapted for positioning/locating, attaching, and supporting the computer card to enable cards to be blind mated from the rear of the system (or rear of the enclosure).

2. Relevant Background

There are numerous settings or environments where electronic equipment, computers and computer equipment (e.g., servers, routers, and so on), and telecommunications equipment are provided in a centralized location in standard or conventional racks. Often, this equipment is provided within a box or chassis ("enclosure") that is then mounted within the rack. Such use of racks with configurable electronic or computer devices each in a chassis can be found in data centers, computer rooms, network rooms, control rooms, telecommunication centers, and so on. As a specific example, servers and other computing devices are often each provided in such a chassis.

Once these computing devices are assembled and/or placed on a rack, it may be desirable to later add an additional computer card (or expansion card or add-on card). In general, a computer card is an expansion device that provides an existing computer or computing device with certain added capabilities. As one specific example, a PCIe card may be added to a computing device to provide lower latency and higher data transfer rates than parallel busses as every device that is connected to a motherboard with a PCIe link has its own dedicated point-to-point connection. A challenge with adding computer or expansion cards to a previously-assembled and/or rack-mounted computing device is how to achieve proper locating of the card's connectors with the receiving connectors (e.g., PCIe standard electrical interface connectors or slots) provided within the computing device such as on another board or card in the enclosure.

For example, PCIe cards require an insertion orthogonal to the rear of the enclosure or computing system, where the card bulkhead and connectors are located. To allow, a computer card such as a PCIe card to be inserted without a carrier requires access to the top of the enclosure (and receiving card) for vertical insertion/mating. However, there are many situations in which top or upper access is not available such as with a previously rack-mounted device (e.g., a rack-mounted server or the like), and, in these applications, rear access blind mate is required. Hence, a card carrier has been utilized to achieve a rear-of-the-system blind mate between the card in the carrier and receiving electrical connectors.

While the present card carriers are able to achieve proper blind mates, these card carriers are relatively costly. For example, some current PCIe card carriers include a complex and expensive cast metal frame as well as a printed circuit assembly (or circuit board) to secure the card within the carrier and to reorient the signals from the PCIe card to a front-to-back configuration. These PCIe card carriers also rely on a specialized connector to mate the card carrier with the system in the enclosure, e.g., to allow rear insertion of card carrier and avoid vertical insertion from behind or with only rear access. As a result, the existing PCIe card carriers cost in the range or $80 to $120 USD to manufacture and fabricate, which can significantly and undesirably increase the cost to add a computer card to a computing device or system.

SUMMARY

Briefly, a card carrier is provided for supporting and locating a computer card (such as a PCIe card and, more specifically, half length, low profile PCIe cards) and for enabling vertical insertion including blind mating with connectors with only rear access (i.e., horizontal access and not top access) to a computer/electronics enclosure. The card carrier has a design that facilitates very inexpensive fabrication, such as with most features being formed from plastic rather than being die cast metal components to provide a fabrication cost that is in the range of one tenth to one twentieth that of many prior card carriers. The new card carrier includes features to secure a computer card and to provide an innovative rotational seating of the secured/retained card into an industry standard connector (e.g., a PCIe standard connector) within the system/computing device in an enclosure. The low cost carrier, as a result, provides vertical insertion/blind mate without the need for an additional circuit board (e.g., a PCA) as was the case with prior PCIe carriers.

More particularly, a computing apparatus is provided that is adapted for rear access installation of a computer card with blind mating with receiving connectors of a previously mounted board (e.g., a PCA or the like). The apparatus includes an enclosure with sidewalls defining a rear access opening and a circuit board mounted in an interior space of the enclosure to have a horizontal orientation and with an upward facing connector (e.g., a standard connector for receiving a PCIe card connector). The apparatus also includes a guide assembly comprising a guide mounted within the interior space, and the guide includes a travel surface (e.g., a horizontal shelf) extending over the upward facing connector of the circuit board (e.g., at a height a predefined amount greater than the height of the board connector).

The apparatus further includes a card carrier with a frame or body that houses a computer card. The computer card (e.g., a PCIe card or the like) includes a connector extending outward from the frame of the card carrier. The card carrier first rides upon the travel surface when the card carrier is inserted into the interior space via the rear access opening and second pivots about a contact surface in the guide assembly when the computer card connector is proximate to the upward facing connector to provide vertical insertion of the computer card in the enclosure and blind mating between the upward facing connector and the computer card connector.

In some embodiments, the guide further includes a downward ramp adjacent to (e.g., more inward or downstream of) the travel surface extending over the upward facing connector leading to the contact surface, and the guide assembly includes a lead-in nose on an end of the frame of the card carrier that abuts the contact surface during the pivoting of the card carrier about the contact surface. The frame of the card carrier includes a bottom contact surface that angles upward away from the lead-in nose or that is arcuate in shape to arch upward away from the lead-in nose. In some preferred embodiments, the frame is fabricated of plastic, and the card carrier further includes a metal shield (e.g., an EMI shield) extending along an end of the frame opposite the nose. The card carrier further may include a latch assembly pivotally coupled to the end of the frame proximate to the metal shield, and the latch assembly includes at least one metal grounding member grounding the card carrier via electrical contact with the enclosure when the card carrier is inserted into the interior space of the enclosure.

In some implementations of the computing apparatus (e.g., a server in a rack-mountable chassis), the guide is mounted onto the circuit board within the enclosure, and the travel surface of the guide includes a gap exposing the upward facing connector of the circuit board to allow blind mating with a properly located connector on the card in the card carrier. In the same or other implementations, the frame includes a top member and a base member (e.g., is a two-part construction). The computer card includes at least one mating member extending outward from an edge of the computer card at a location spaced apart from the computer card connector, and the computer card is received within an envelope defined between a sidewall of the top member and a sidewall of the base member. Further, the base member includes a platform extending outward from the sidewall of the base member that includes a slot for receiving the at least one mating member to locate the computer card within the card carrier.

The top member may be pivotally coupled to the base member for pivotal positioning away from the base member in an open state of the card carrier and in contact with the base member in a closed state of the card carrier. The top member may include a cover/roof extending (e.g., orthogonally) from the sidewall of the top member, and inner surfaces of the cover/roof contact an edge of the computer card opposite the computer card connector when the card carrier is in the closed state/configuration to control vertical movement of the computer card within the card carrier. The platform on the base member may further include an additional slot for receiving a portion of a bulkhead of the computer card to locate the computer card at a predefined location along a longitudinal axis of the frame.

BRIEF DESCRIPTION OF THE DRAWINGS

FIG. 10 illustrates a detailed view of the rear portion of the card carrier of FIGS. 7-9 after full insertion of the computer card and prior to closing (or placing the card carrier into the closed state or arrangement for insertion into an enclosure);

FIG. 11 illustrates a detailed view of the rear portion of the card carrier similar to FIG. 10 but with the card and top member removed to show additional features of the base member of the card carrier;

DETAILED DESCRIPTION

The present description is directed toward a computer card carrier adapted for receiving and securely locating an off-the-shelf computer card. The present description is also directed toward computer apparatus with the new card carrier with a computer card housed therein received into its enclosure. The card carrier may be used, for example but not limitation, as a low-cost PCIe card carrier that is designed particularly to enable the PCIe card in the carrier to be blind mated from the rear of a computer apparatus enclosure. In some embodiments, the card carrier excludes any additional circuit boards and is all plastic (except for shielding (e.g., EMI shielding provided by sheet metal fingers or the like)) to allow it to be manufactured at relatively low cost.

The card carrier is adapted for receiving, retaining, and accurately locating an off-the-shelf computer card. The card carrier is further adapted for a vertical insertion of the computer card from behind or front-to-back (e.g., without top access). The card carrier includes a frame or body for receiving the computer card, and a portion of a guide assembly with a foot at a front or leading edge of the frame/body (and with another portion of the guide assembly provided in the enclosure including a guide member with a ramp over board connectors for the card).

During manual insertion of the card into an enclosure, the guide assembly ramp guides the pivot foot on the frame/body into a pivot trough provided in the enclosure as part of the enclosure-mounted guide member proximate to the standard card connectors. Once the pivot foot is engaged or fit into the end of the pivot trough, the card carrier can be pivoted downward about the point of contact between the pivot foot and the pivot trough to get a vertical blind mate from a horizontal or rear access. A locking assembly is also included on the frame/body opposite the guide assembly (or on a back edge/side of the frame/body), and the locking assembly includes a lever than is manually lifted/manipulated to engage the locking assembly to lock the card carrier in place in the enclosure by preventing upward vertical movement of the card carrier.

Figure 1:
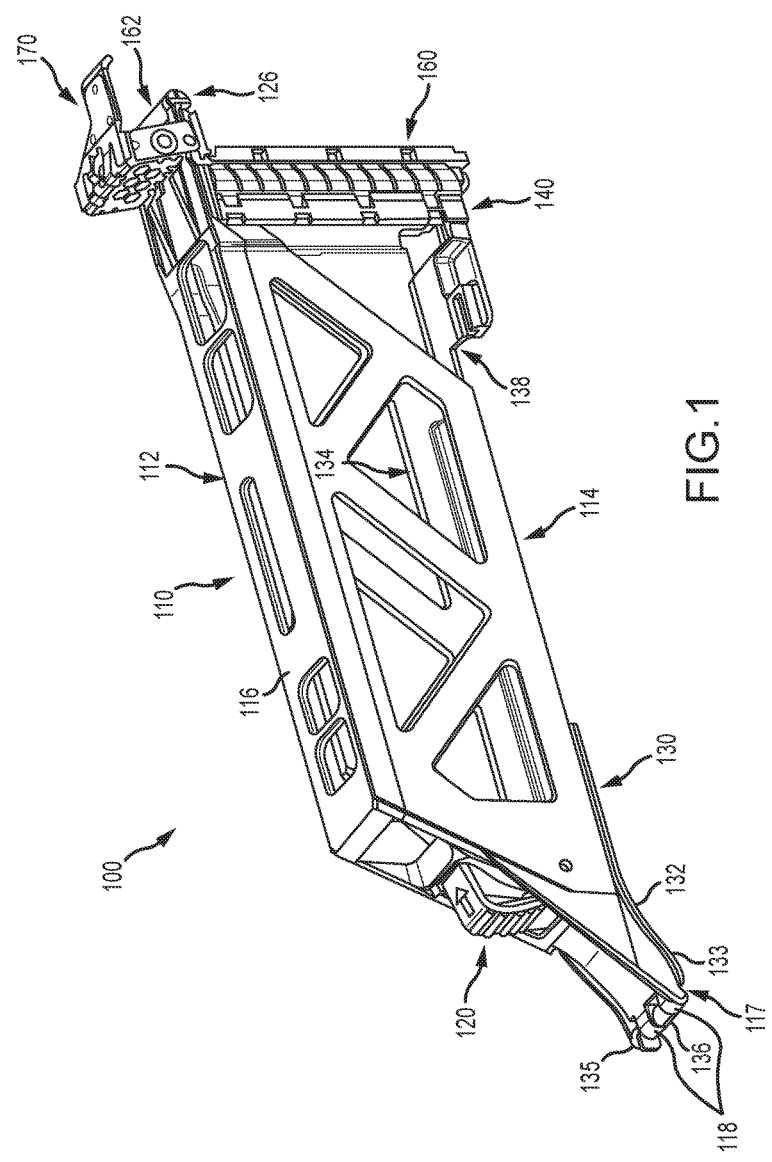
FIG. 1 is a front, upper perspective view of a card carrier of the present description in its closed state or arrangement prior to insertion of a computer card such as a PCIe card.
Figure 2:
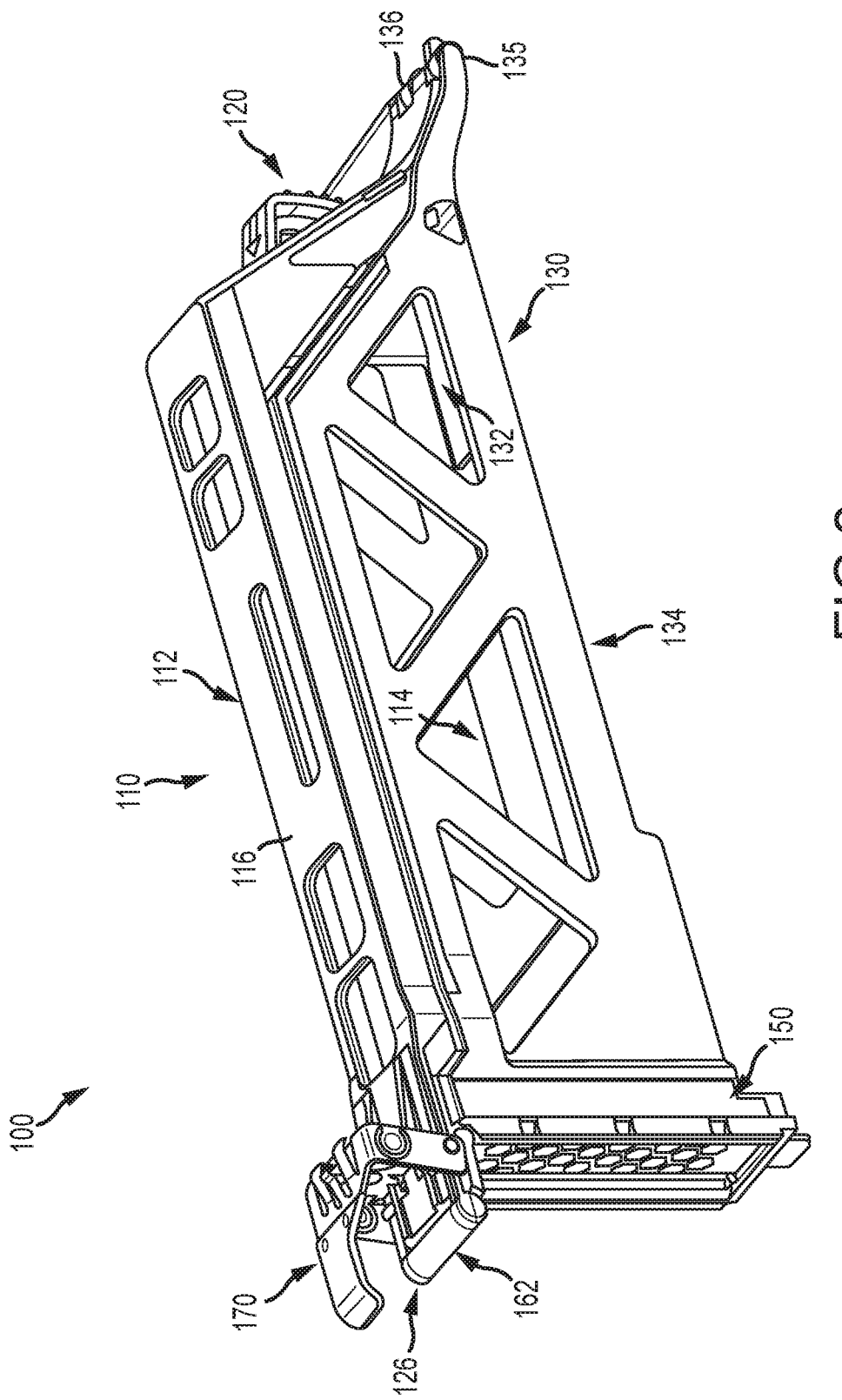
FIG. 2 is a rear, upper perspective view of the card carrier of FIG. 1.

FIG. 1 is a front, upper perspective view of a card carrier 100 of the present description in its closed state or arrangement prior to insertion of a computer card such as a PCIe card. FIG. 2 is a rear, upper perspective view of the card carrier 100 of FIG. 1. The card carrier 100 includes a frame or body 110 that is of a two-part construction with a top member 112 and a bottom or base member 130, and FIGS. 1 and 2 show the card carrier 100 in the closed state or configuration prior to receipt of a card member in the carrier 100 (e.g., between the two members 112, 130).

In addition to the top and base members 112, 130, the card carrier 100 includes an EMI gasket for providing EMI/EMC sealing for the carrier 100 and any card received therein. The carrier 100 also includes a rear base member 160 for affixing the gasket 150 to the rear end/edge 140 of the base member 130 and for providing an upper half 162 of a snap-fit carrier hinge that allows the top member 112 to pivot relative to the base member 130 to open and close the card carrier 110 (as shown in FIGS. 6-12). Further, the card carrier 100 includes a carrier vertical latch assembly 170 for latching or locking the card carrier 100 within an enclosure (or within a sled inserted into the enclosure) so as to limit or prevent vertical movement of the card carrier 100, and the latch assembly 170 is pivotally attached to or coupled with the top member 112 (e.g., near to the bottom or outer half 126 of the snap-fit carrier hinge).

As shown, the top member 112 includes a planar sidewall 114 (e.g., a first vertical sidewall of the carrier body/frame 110) with a number of openings to reduce material requirements and to allow airflow around a received card, and the sidewall 114 mates with a cover or roof 116 of the top member 112, which again has openings to reduce material requirements and allow visual confirmation of the presence (or absence) of a card. The cover or roof 116 restrains a received card from vertical movement away from the base member 130 during installation of the card carrier 100 within an enclosure. At a back or rear end of the cover or roof 116, a lower or second half 126 of a snap-fit carrier hinge is provided, while the upper or first half 162 of the snap-fit carrier hinge is provided on the rear base member 160 that is attached to the base member 130 such that the top and base members 112, 130 can be pivotally coupled together.

Once the card carrier 100 is assembled (pivotally coupling between top and base members 112, 130), the card carrier 100 may be placed in the closed state or arrangement as shown in FIGS. 1 and 2 (e.g., by pivoting the top member 112 downward toward the base member 130 about the snap-fit carrier hinge). The top member 112 is coupled or locked to the base member 130 near its front or forward end with forward or opening latch 120, which mates with a hook or latch engagement element provided on the base member 130 (not visible in FIGS. 1 and 2 but shown in FIG. 3 with reference number 139). The latching or locking can be released by manually pressing the latch 120 toward the frame or body 110 (or moving the latch 120 inward). The latch 120 is configured to provide a self-locking feature, and the latch 120 is designed in some embodiments so that pulling up on the top forces the latch 120 to become more tightly latched rather than popping loose.

The base member 130 also includes a planar sidewall 134, which may be similar in shape and size as the sidewall 114 and be space apart a distance (e.g., 0.25 to 1.25 inches) as defined by a width of the top/roof 116 of the top member 112. As shown in FIG. 2, the top member 112 may also include a lip or second planar sidewall opposite the sidewall 114 along with a front or leading sidewall to further enclose the envelope or interior space defined by the two planar sidewalls 114 and 134 of the top and base members 112, 130. The base member 130 includes a forward floor or platform element 132 and a rearward floor or platform element 138 that are each generally planar and extend orthogonally outward from a bottom edge or end of the planar sidewall 134 (with the forward floor/platform 132 being near the nose of the carrier 100 and the rearward floor/platform 138 being near the rear end/edge 140 of the base member 130).

The card carrier 100 includes features of a guide assembly of the present description for use in installing the card carrier 100 within an enclosure while the other features of the guide assembly are provided by a guide installed on a board (or over a board) within the enclosure. With regard to the top member 112, an upper half 117 of a carrier nose or carrier lead-in element is provided on the top member at forward or front end. Curved or rounded mating elements 118 are attached to this (or provided as part of this) upper half 117 of the carrier nose or lead-in element, and these intertwine with similar curved or rounded mating elements (or one element) 136 of a lower half 135 of the carrier nose provide on the base member 130. The carrier nose formed with halves 117, 135 and/or its mating elements 118, 136 mates with receiving surfaces/features of a guide positioned within an enclosure on or over a circuit board with its receiving connectors.

Figure 17:
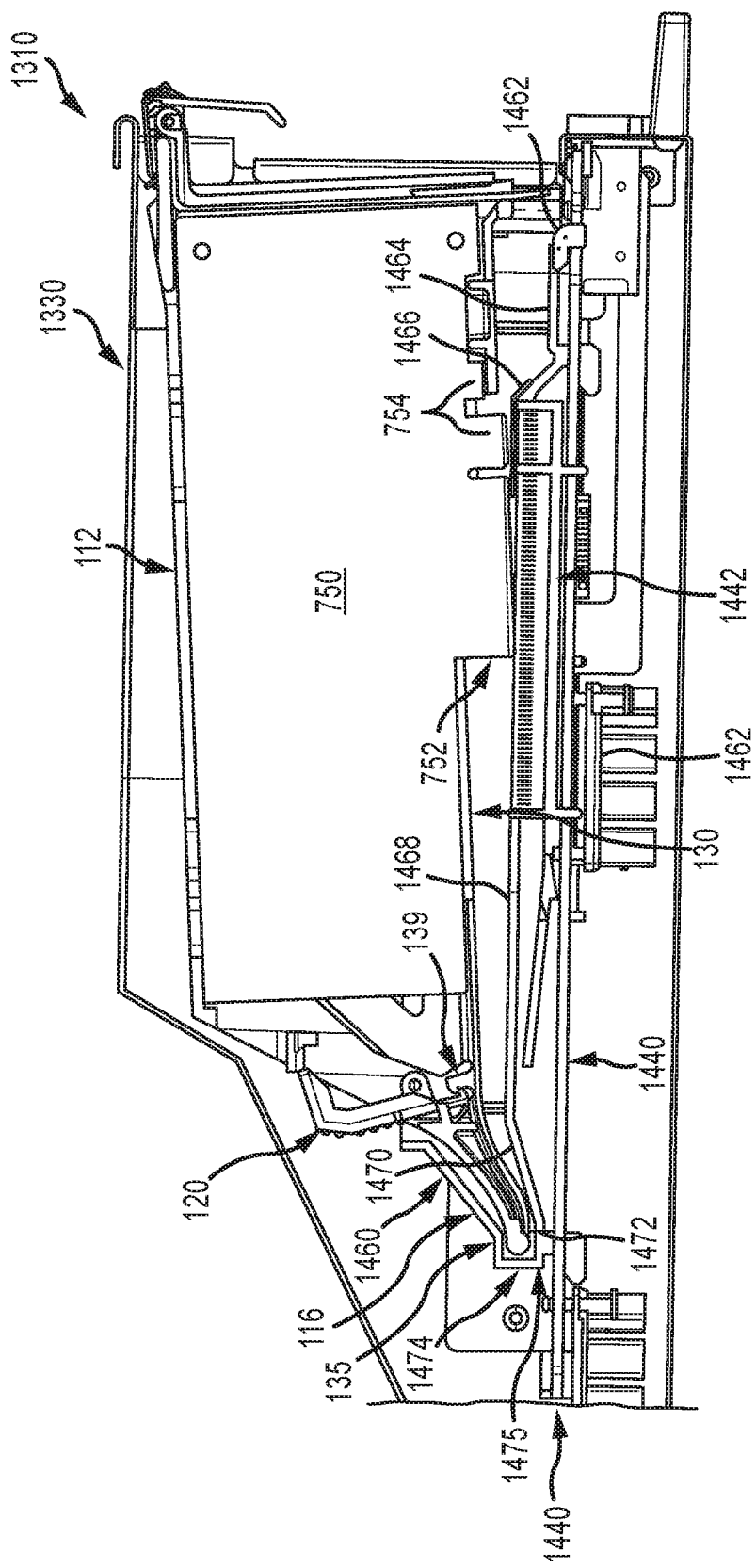
FIG. 17 illustrates the computer apparatus of FIG. 16 at a yet later or final step of installing the card carrier.
Figure 18:
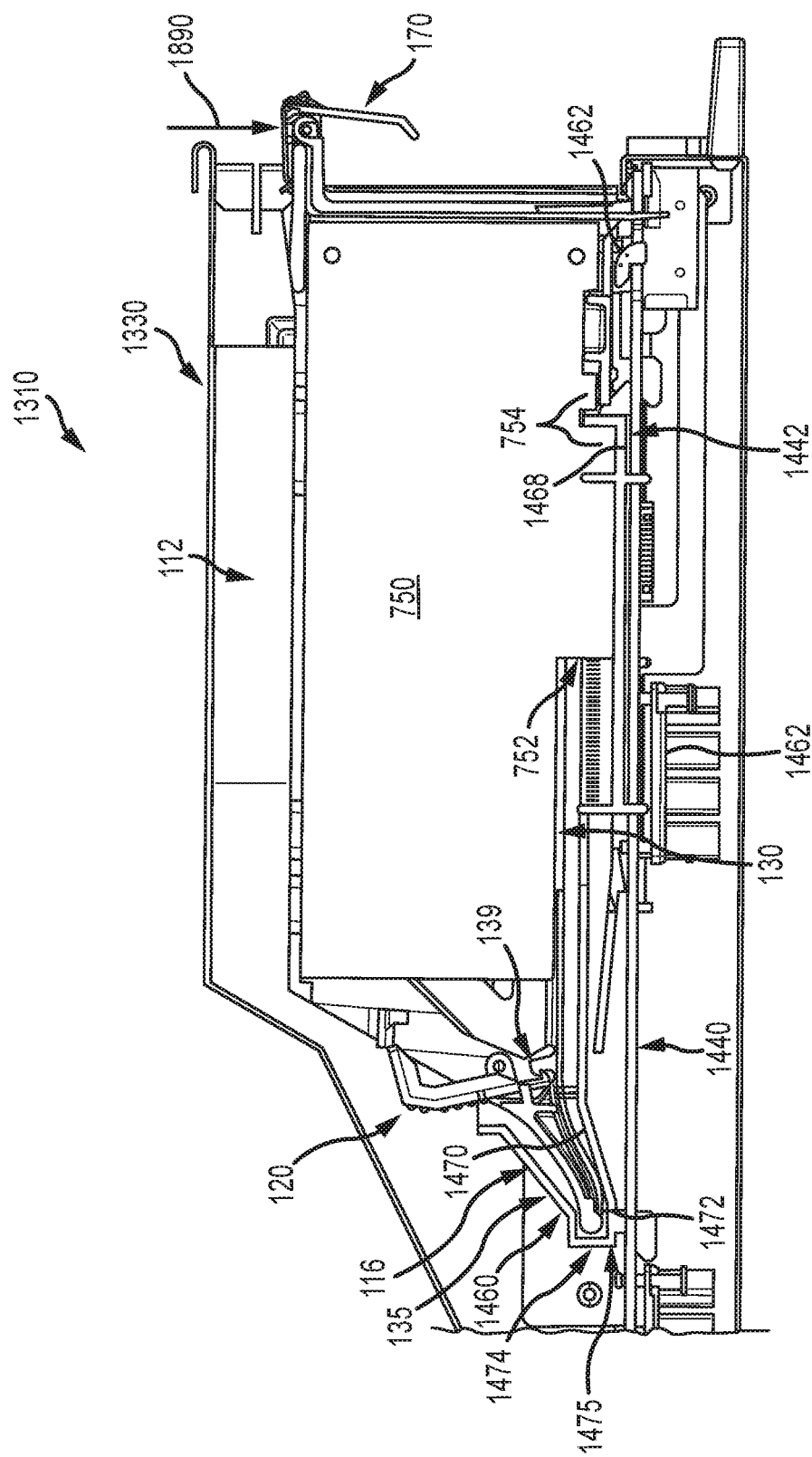
FIG. 18 illustrates the computer apparatus of FIG. 17 after (or while) installation of the card carrier is completed showing the completed mating between the card's connectors and the receiving connectors of the circuit board in the enclosure.

The carrier nose and/or mating surfaces with the guide provided in the enclosure also include a curved or arcuate bottom surface 133 of the forward floor/platform 132. This surface 133 is shaped to ramp upward at an angle from the nose halve 135 to a more horizontal run such as at an angle of 30 to 45 degrees, and this provides an offset (such as of 0.2 to 0.5 inches) to allow the nose to be in contact with guide surfaces in the enclosure but yet position a card's connectors a distance away from receiving connectors of a board in the enclosure until the carrier 100 is in its most forward (or most inserted) position at which point the carrier 100 can be rotated downward to achieve vertical insertion (or blind mating of the carried card and the board's receiving connectors as seen in FIGS. 17 and 18).

Figure 3:
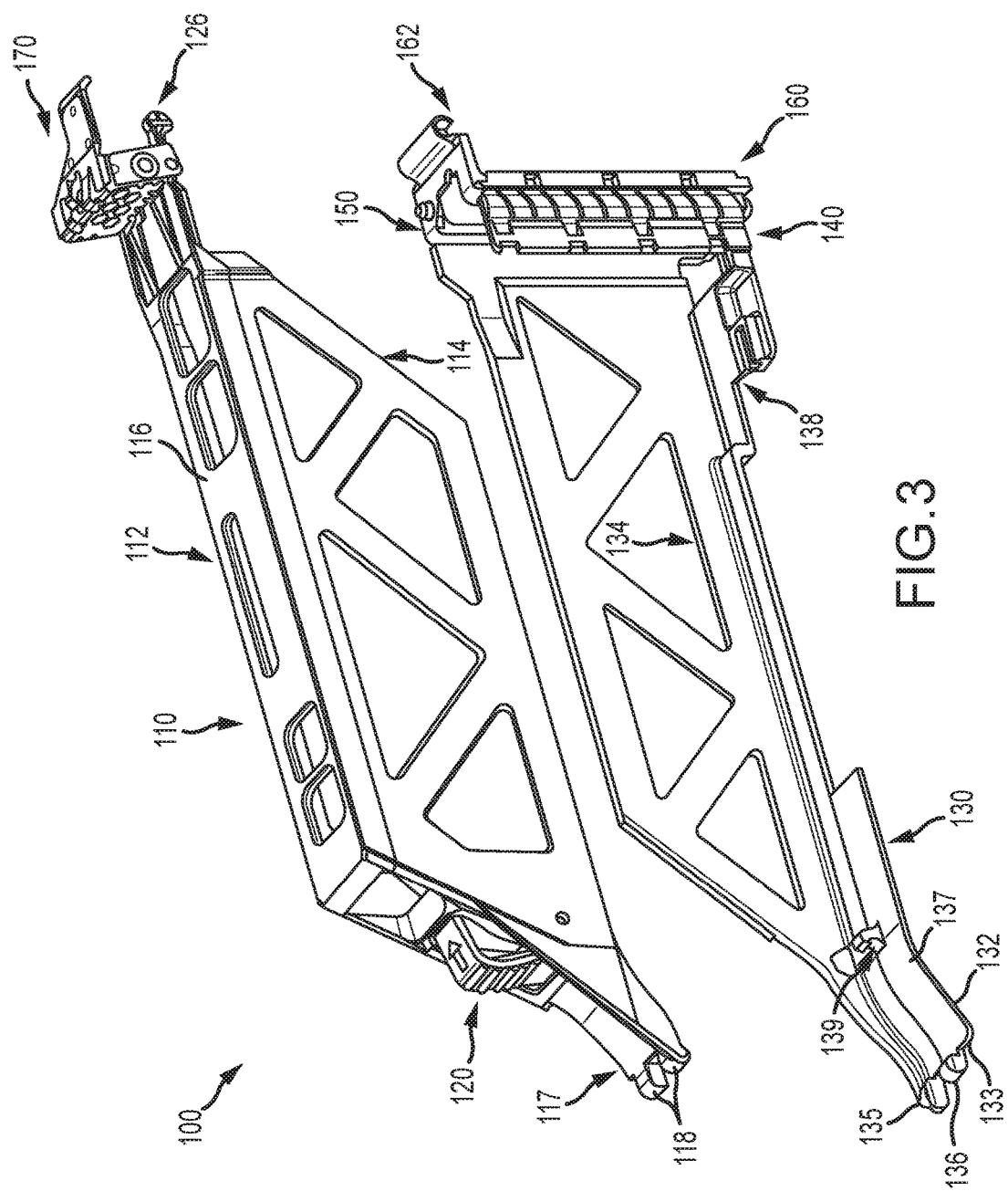
FIG. 3 is an exploded view of the card carrier of FIG. 1 top and base members of the two-part carrier frame or body in more detail.

FIG. 3 is an exploded view of the card carrier of FIGS. 1 and 2 showing aspects of the top and base members 112, 130 of the two-part carrier frame or body 110 in more detail. For example, FIG. 3 shows the configurations of this exemplary design of the carrier 100 for the forward platform/floor 132 as well as the rearward platform/floor 138 (with features provided for receiving a card discussed in more detail with reference to FIGS. 9-11). Also, FIG. 3 illustrates the hook or latch engagement element 139 that mates with forward or opening latch 120 when the top member 112 is pivoted about the snap-fit hinge to engage the base member 130 near the nose or front end of the carrier body/housing 110. FIG. 3 also shows the snap-fit carrier hinge in more detail including illustrating the upper half 162 being provided as an elongated member with a U-shaped cross section and the lower/outer half 126 including a pair of posts that are received into or snapped into the interior surfaces of the U-shaped upper half 162 to fit the top and base members 112, 130 together (for pivotal coupling that allows pivoting about an axis extending through the two posts of the lower/outer half 126).

Figure 4:
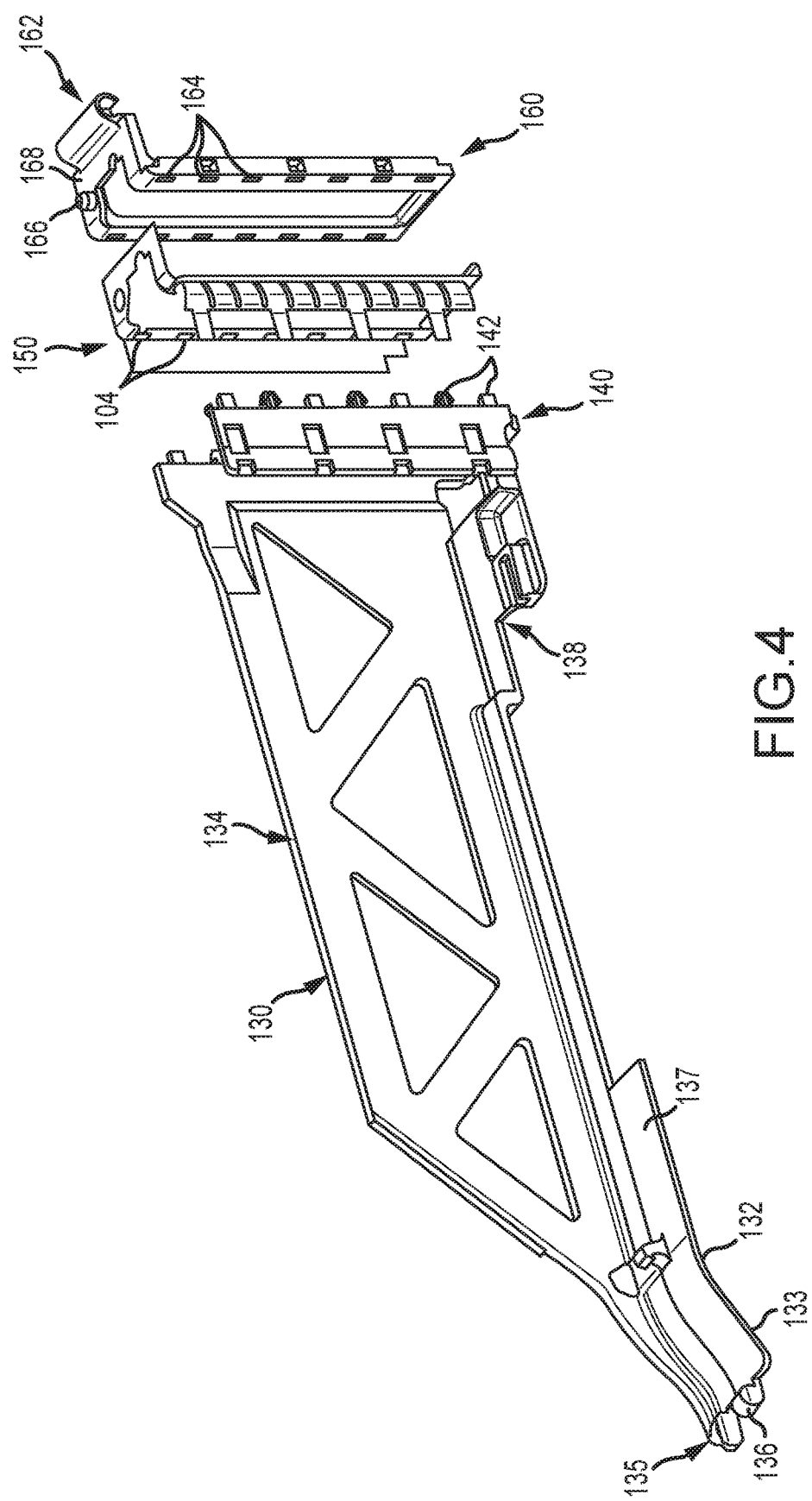
FIG. 4 is an exploded view of the base member of the carrier frame of FIG. 3.

FIG. 4 is an exploded view of the base member 130 of the carrier frame 110 of FIG. 3. As shown, the rear base member 160 includes a number of holes 164 in its body as does the EMI gasket 150 as shown at 104, such that these pieces can be snapped together (in a snap-fit manner) via tabs 142 (which may be hook or L-shaped in some embodiments) with the rear edge/end 140 of the base member 130. The snap-together design (with adhesive tabs 142) reduces cost and complexity of assembly to reduce or control fabrication costs of the carrier 100. The EMI gasket 150 is sandwiched between the edge 140 and base rear member 160 to retain it in the carrier 100 and to locate its features relative to a later-received computer card. The EMI gasket 150 may be formed of an electrically conductive spring sheet metal (e.g., stainless steel, beryllium copper, or the like) to provide EMI/EMC sealing for the carrier 100 and a card held between the sidewalls 114, 134 of the top and base members 112, 130, and the gasket 150 may include a hole on an upper shelf/lip to mate with post 166 and surface 168 of the rear base member prior to mating the member 160 with the rear edge/end 140 of the base member 130. The gasket 150 may take a variety of shapes to provide the shielding functionality such as the configuration shown with a central opening and two side columns extending the height of the edge/side 140 of the base member 130.

Figure 5:
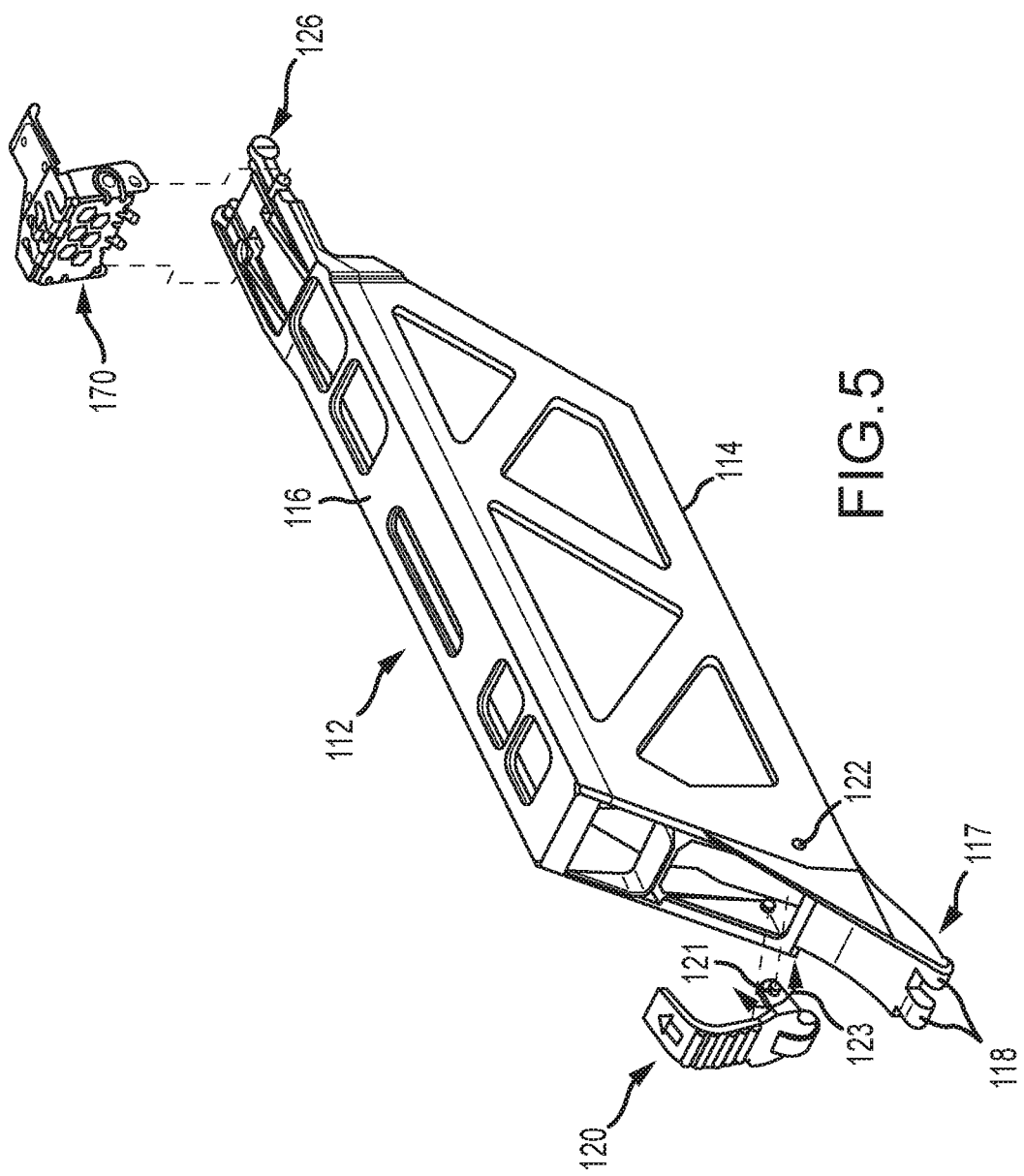
FIG. 5 is an exploded view of the top member of the carrier frame of FIG. 3.

FIG. 5 is an exploded view of the top member 112 of the carrier frame 110 of FIG. 3. FIG. 5 is useful for showing an exemplary design for the front carrier latch 120 that includes posts 121 for allowing the latch 120 to be snapped together with the top member 112 via holes 122 in its sidewall(s) 114. This snap-fit assembly allows the latch 120 to pivot about an axis passing through the center of posts 121 as shown with arrows 123 to latch the top member 112 to the base member 130 (and to unlatch the two members 112, 130 of the frame/body 110). FIG. 5 also shows that the carrier vertical latch assembly 170 is adapted to be snapped upon posts of the cover/roof element 116 of the top member 112 near to (e.g., within 0.25 to 0.75 inches of) the lower/outer half 126 of the snap-fit hinge. The carrier vertical latch assembly 170 is rotatable about a center axis of the mounting posts on the cover/roof element by manipulation of an arm shown to be extending outward away from the top member 112.

Figure 6:
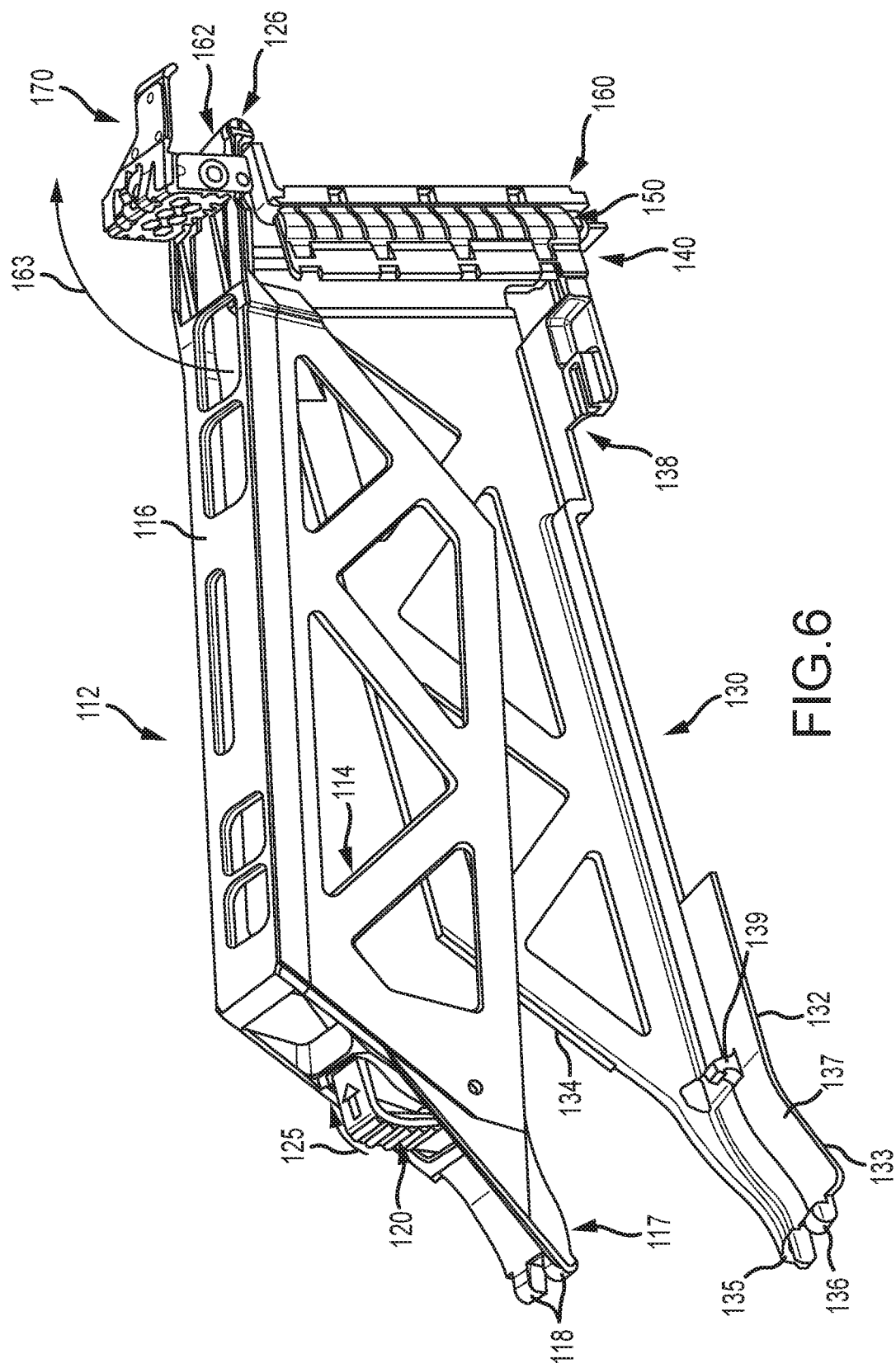
FIG. 6 shows the card carrier of FIG. 1 as it is being opened to receive a computer card.
Figure 7:
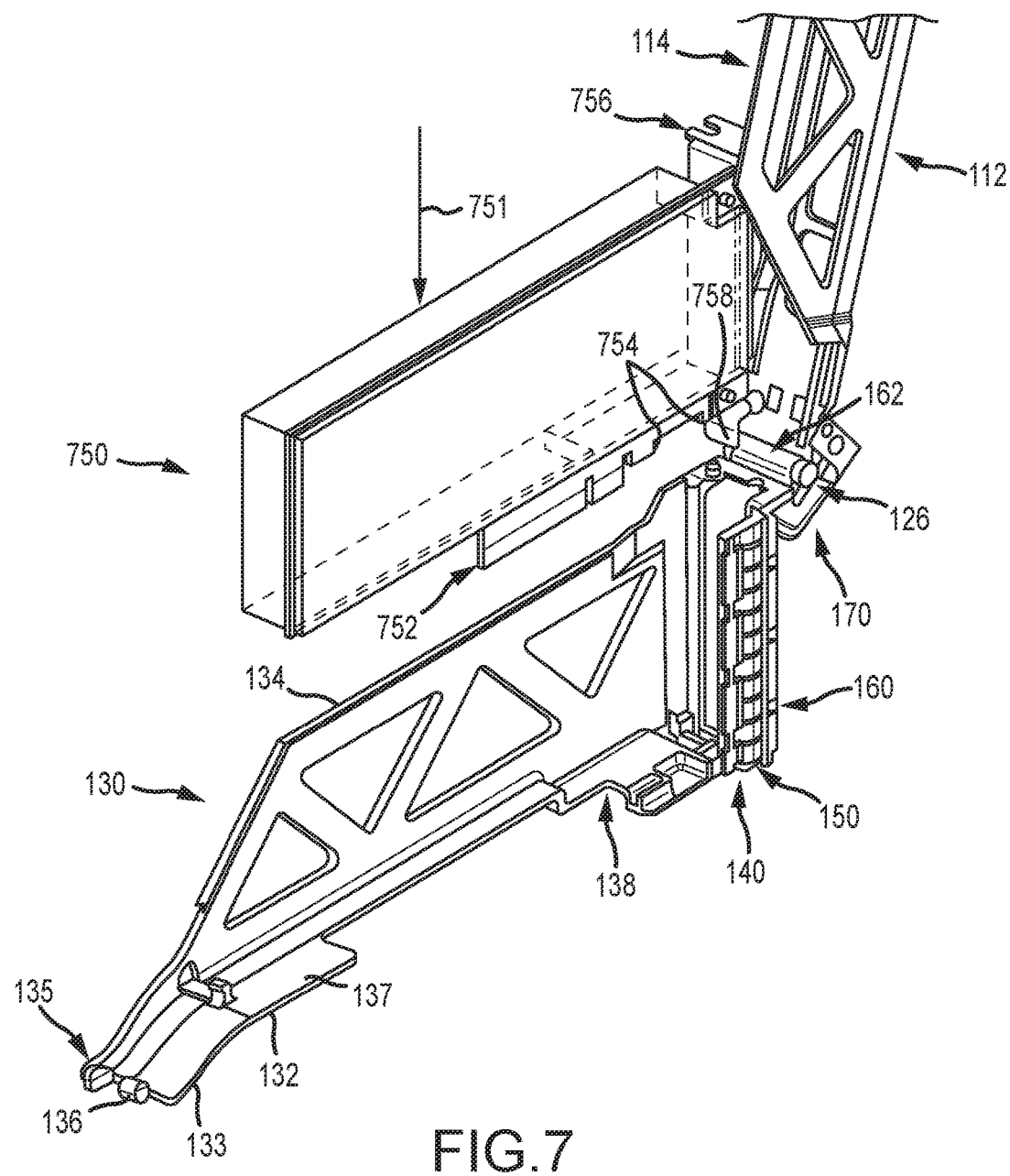
FIG. 7 shows the card carrier of FIGS. 1 and 6 after the card carrier has been fully opened and during initial insertion of a computer card into the card carrier.

FIG. 6 shows the card carrier 100 of FIG. 1 as it is being opened to receive a computer card (not shown in FIG. 6 but is shown in FIG. 7). As indicated with arrow 125, the latch 120 is actuated by pressing its body inward to rotate/pivot about the posts that causes it to disengage from the hook element 139 on the base member 130. This allows the top member 112 to be pivoted as shown with arrow 163 up and away from the base member 130 about the hinge provided by coupling of upper and lower halves 126 and 162 of the snap-fit hinge. The pivoting 163 is continued to wholly expose the base member 130 including the rearward floor/platform 138 and its features that guide/receive a computer card (e.g., until cover 116 of the top member 112 is at 90 degrees or more relative to the floor members 132, 138 of the base member 130 as shown in FIG. 7).

FIG. 7 shows the card carrier 100 of FIGS. 1 and 6 after the card carrier 100 has been fully opened and during initial insertion of a computer card 750 into the card carrier 100. The card 750 may take the form of a PCIe card or another expansion or computer card, with the card 750 shown to include electrical connectors 752 and guide/mating members 754 along the lower edge for mating with receiving connectors on another board (e.g., a circuit board mounted in an enclosure such as a server chassis or the like). The card 750 has a bulkhead including upper and lower structural members 756, 758 near a rear or outer edge. As shown with arrow 751 in FIG. 7, the computer card 750 is initially inserted or positioned inside the space or envelope of the card carrier 100 by moving the lower edge of the card 750 with its connectors 752 and guide/mating members 754 downward into the space between the two sidewalls 114, 134 (or toward the floor/platform members 132, 138 of the base member 130).

Figure 8:
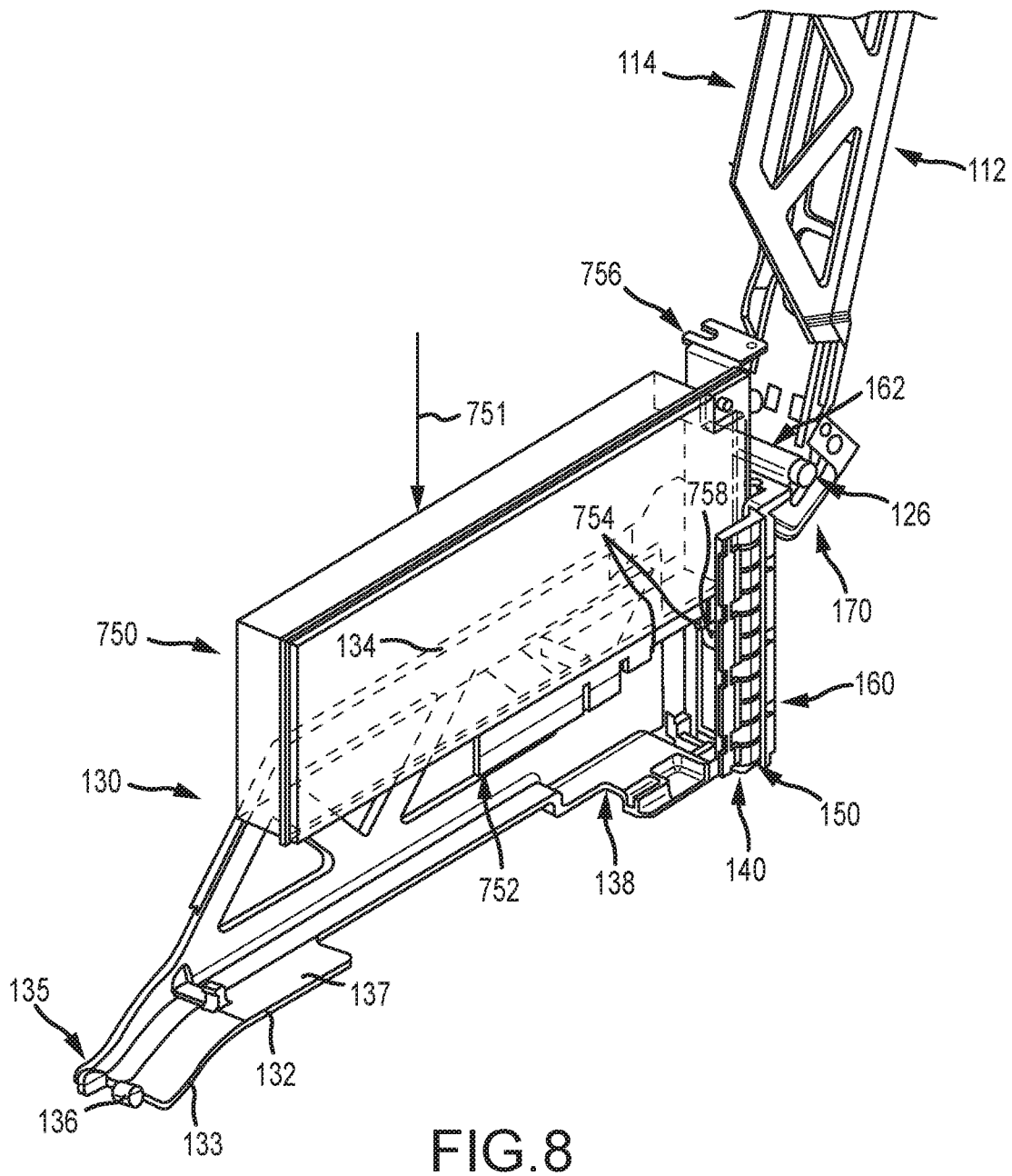
FIG. 8 shows the card carrier of FIG. 7 at a later or intermediate stage of the card insertion.

FIG. 8 shows the card carrier 100 of FIG. 7 at a later or intermediate stage of the card insertion. Specifically, the card 750 is further vertically inserted as shown with arrow 751 with the guide/mating members 754 being moved closer to the rearward floor/platform 138 of the base member 130. Also, the bulkhead upper and lower structural elements 756, 758 are generally aligned or positioned to be between the sidewalls of the outer edge/end 140 of the base member 130 (and to be between sidewalls of the EMI gasket 150).

Figure 9:
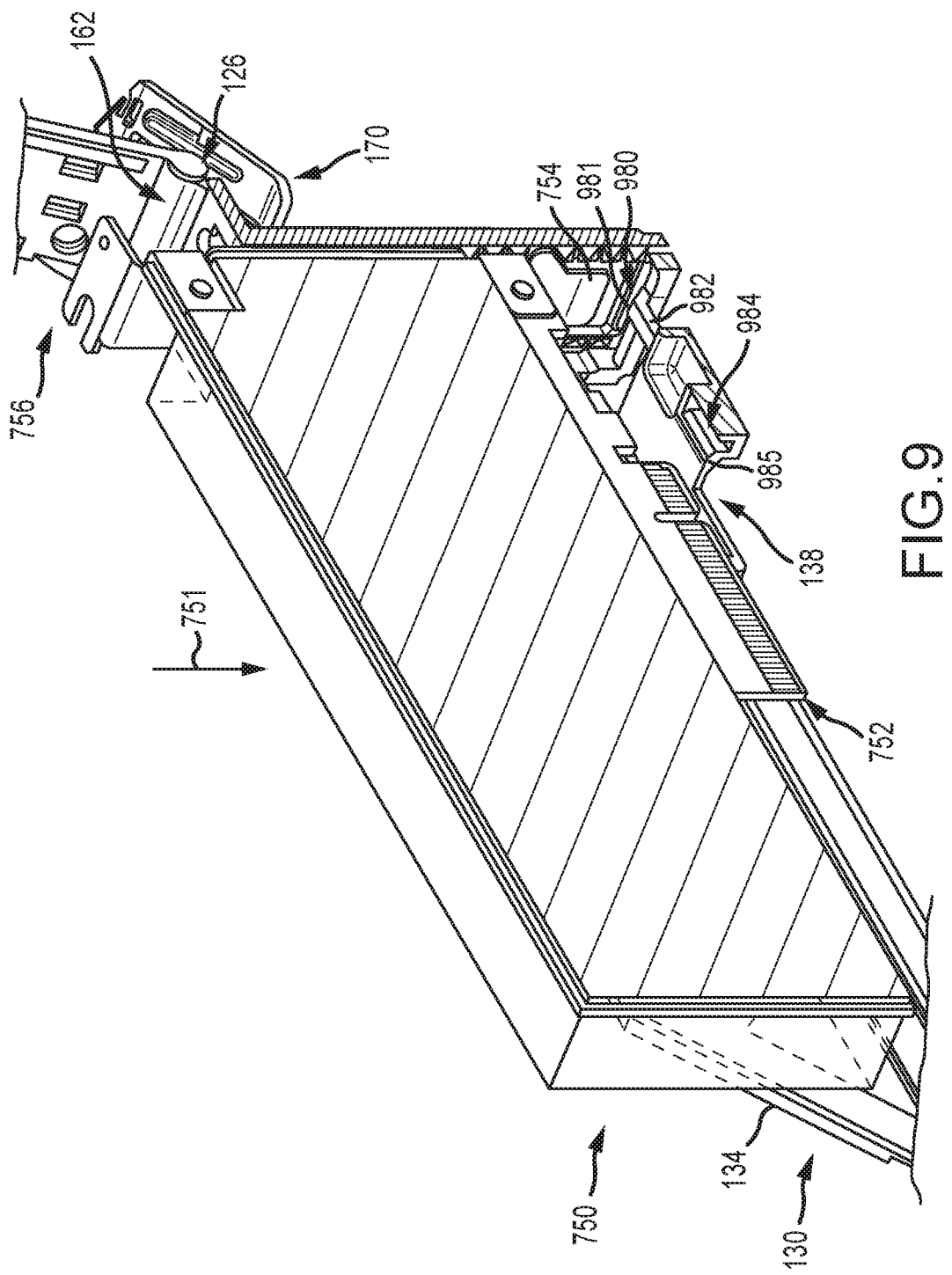
FIG. 9 shows the card carrier of FIGS. 7 and 8 at a yet later or final stage of the card insertion.

FIG. 9 shows the card carrier 100 of FIGS. 7 and 8 at a yet later or final stage of the card insertion. Particularly, the card 750 is moved (manually by a person's hand (not shown)) toward the base member 130 with the sidewall 134 providing horizontal and vertical guidance or positioning as does end/edge 140 of the base member 130 with the outer bulkhead of the card 750 against or near the end/edge 140. FIG. 9 also illustrates aspects of the rearward platform/floor 138 that are useful for receiving, retaining, and locating the card 750 within the card carrier 100 both relative to the two planar sidewalls 114, 134 and along the longitudinal axis of the frame/body 110. As shown, the floor/platform 138 of the base member 130 includes a first engagement or lead-in element 980 and a second engagement or lead-in element 984 for mating with the lower structural member 758 of the card bulkhead and with the guide/mating elements 754 of the card 750. The first engagement or lead-in element 980 includes a slot 981 along with a bar 982 extending away from the slot 981 parallel to the longitudinal axis of the base member 130, and the second engagement or lead-in element 984 includes or takes the form of a slot in the platform/floor 138 open at edge/end 138 of the platform/floor 138 to allow for positional adjustments along the longitudinal axis of the carrier 100 during assembly.

FIG. 10 illustrates a detailed view of the rear portion of the card carrier 100 of FIGS. 7-9 after full insertion of the computer card 750 and prior to closing (or placing the card carrier 100 into the closed state or arrangement for insertion into an enclosure). As shown, the bottom structural element 758 of the bulkhead of the card 750 extends through the slot 981 of the first engagement or lead-in element 980 while the upper structural element 756 mates with post 166 and surface 168 of the base rear member 160 (to sandwich an upper lip or shelf of the EMI gasket 150). Also, the card guide/mating elements 754 are received within an opening between the bar 982 and an outer wall of the floor/platform 138 and in the slot of the second engagement or lead-in element 984.

These features of the base member 130 are shown in more detail in FIG. 11, which illustrates a detailed view of the rear portion of the card carrier 100 similar to FIG. 10 but with the card 750 and top member 112 removed to show additional features of the base member 130 of the card carrier 100. The pin/post 166 and mating surface 168 of the base rear member 160 act to locate the top of the card 750 (or its bulkhead via upper structural element 756). The EMI gasket 150 has fingers 154 that provide an EMI seal to the card bulkhead. The slot 981 acts to position and limit further movement (once received) of the card bulkhead's bottom structural element 758. The bar 982 provides lead-in (blind mate) for installation of the card 750 into the card carrier 100. The slot/second lead-in element 984 controls wag (or yaw movement) of the card 750 once one of the guide/mating elements 754 of the card 750 is received in the slot 984 as shown in FIG. 10.

Figure 12:
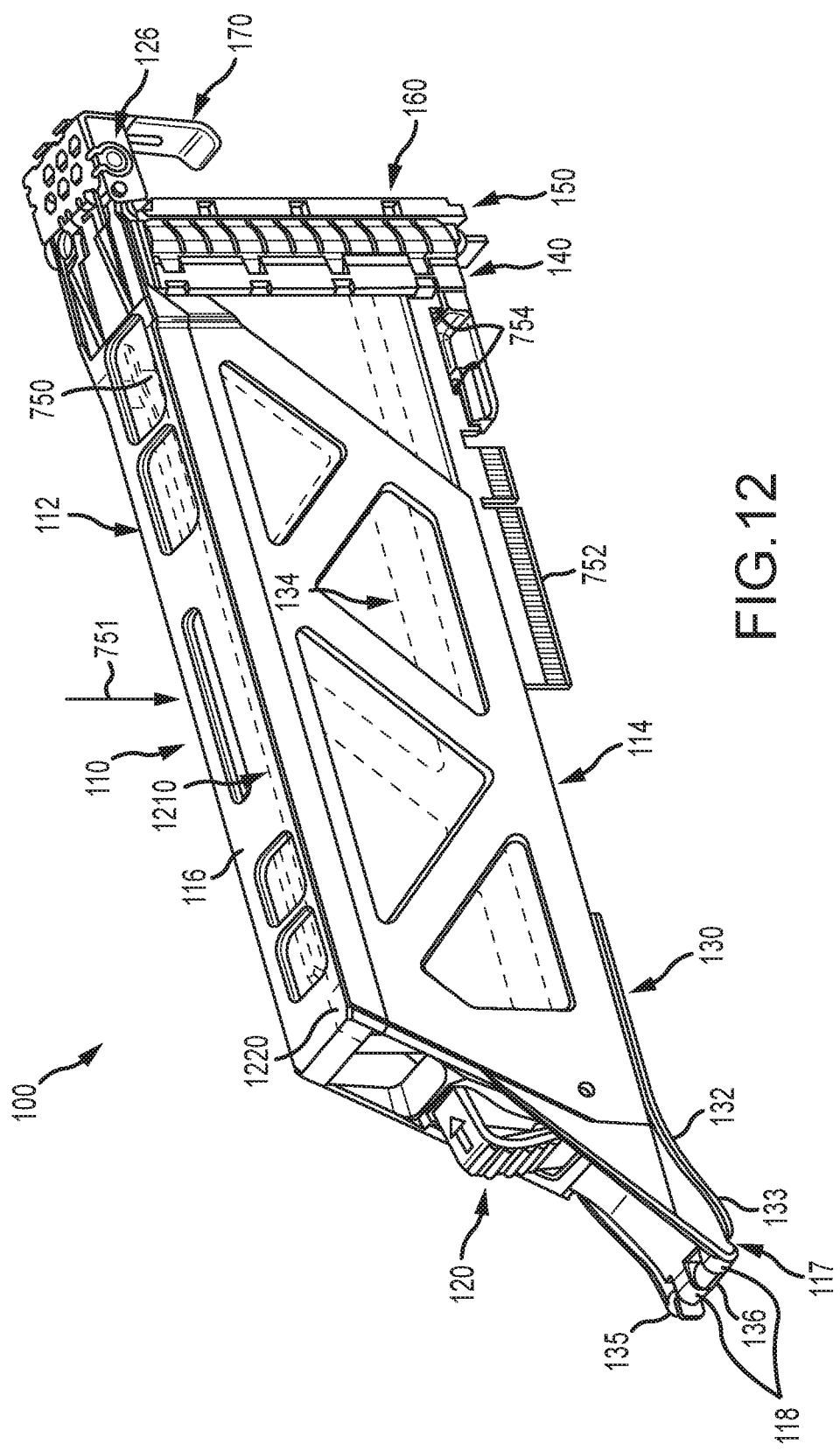
FIG. 12 illustrates the card carrier of FIGS. 7-11 with the card carrier in the closed state or configuration after insertion of the computer card.

FIG. 12 illustrates the card carrier 100 of FIGS. 7-11 with the card carrier 100 in the closed state or configuration after insertion of the computer card 750. As discussed above, the base member 130 functions to locate and support the card 750 within the card carrier 100. The top member 112 is latched at its front end via latch 120 to the base member 130, and, in this closed state of the card carrier 100, the top member 112 functions to limit or, more typically, prevent vertical movement of the card 750 away from its engagement with the base member 130 (such as during blind mating with between card connectors 752 and receiving connectors on another circuit board and during transportation/storage of the card carrier 100 loaded with the card 750). Dashed line 1210 illustrates or represents a card edge contact with the cover/roof 116 to limit vertical travel of the card 750 and support/resist insertion forces of the card 750 into a board. Dashed lines 1220 show a slot or recessed surface on the roof/cover 116 of the top member 112 (that is hidden from view) that provides wag (or yaw movement) support for the card 750 (i.e., limits card movement orthogonal to the longitudinal axis of the card carrier 100 and card 750).

Figure 13:
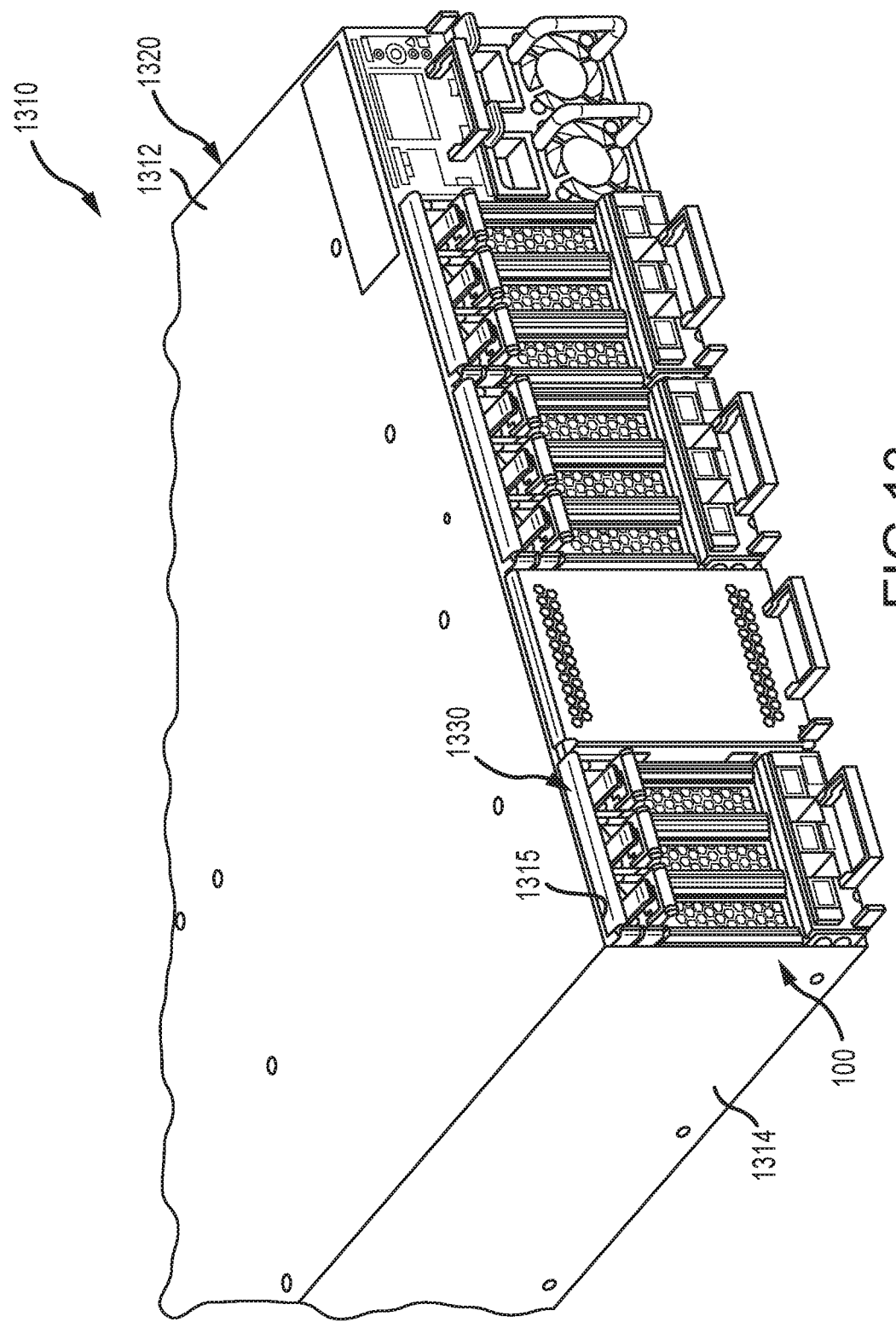
FIG. 13 illustrates a computer or electronics apparatus with the card carrier of FIG. 12 fully inserted into the enclosure (e.g., into a sled that has been inserted into the enclosure and with blind mating for the computer card in the card carrier with receiving connectors on a circuit board in the enclosure)

The card carrier 100 is configured to facilitate, along with guide assembly components within an enclosure, the installation of the card 750 into a computer apparatus/system in the enclosure including providing vertical insertion (blind mating) when only rear access is available to the enclosure. In this regard, FIG. 13 illustrates a computer or electronics apparatus 1310 with the card carrier 100 of FIG. 12 fully inserted into the apparatus' enclosure 1320, which includes left and right sidewalls 1314 and top/cover 1312 (e.g., sheet metal chassis for a rack-mountable server or the like). The enclosure 1320 has no rear sidewall to provide rear access (a rear opening 1315) to the enclosed apparatus or system components such as a circuit board (e.g., a PCA) mounted on a bottom or base sidewall of the enclosure 1320. In this embodiment, a sled 1330 has been inserted via opening/rear access 1315 into the enclosure 1320, and the card carrier 100 is inserted into the sled 1330 with blind mating for the computer card 750 in the card carrier 100 with receiving connectors on a circuit board in the enclosure 1320.

Figure 14:
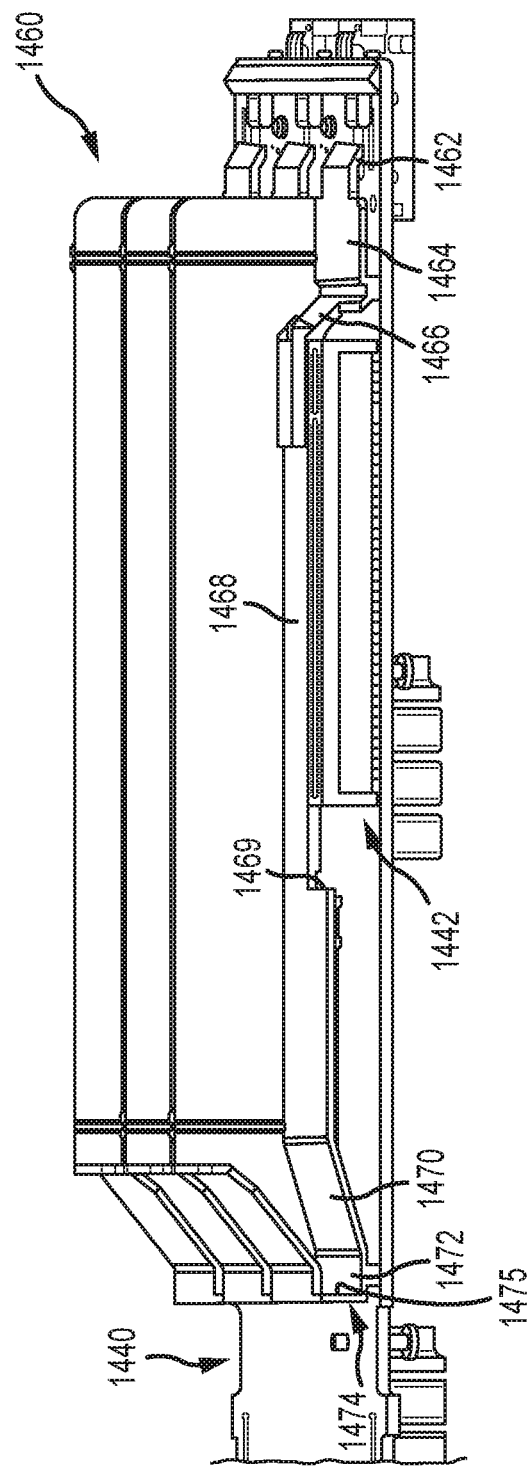
FIG. 14 illustrates a portion of the enclosure of FIG. 13 prior to insertion of the card carrier showing details of a circuit board (e.g., a PCA) with guides of a guide assembly of the present description installed on the circuit board to facilitate vertical insertion with rear access to the enclosure.

FIG. 14 illustrates a portion of the enclosure 1320 of FIG. 13 with the cover 1312 and sidewall 1314 removed and prior to insertion of the card carrier 100. This is useful for showing details of a circuit board (e.g., a PCA) 1440 with a set of guides 1460 of a guide assembly of the present description installed on the circuit board 1460 to facilitate vertical insertion with rear access to the enclosure 1320. The end one of the guides 1460 is used to receive and guide the card carrier 100 and is shown in more detail in FIG. 14. Particularly, this guide includes a number of contact or guiding surfaces to direct the travel of an inserted card carrier (such as carrier 100) relative to receiving connectors 1442 of the board 1440, and the surfaces typically will have a width that is a small amount (such as 0.15 inches or less) wider than the width of the card carrier as measured between outer surfaces of the carrier's sidewalls). Generally, it is desirable to cause the card carrier's two-part body/housing to be caused to travel over the connectors 1442 until the connectors of a card in the card carrier are over the connectors and can be vertically inserted into or blind mated with the connectors 1442.

To this end, the set of guiding/contact surfaces includes a first upward ramp 1462 for initially contacting and receiving the nose of the card carrier so as to guide or urge the card carrier upward from the board 1440. The guiding/contact surfaces further include a first horizontal travel surface 1464 adjacent to the first upward ramp 1462 to guide the card carrier further into the enclosure over the board 1440 at a first height until the card carrier approaches the first/outer edge of the connectors 1442. At this travel point in the enclosure relative to the upper surface of the board 1440, the guiding/contact surfaces include a second upward ramp 1466 for urging or guiding the card carrier upward to a second horizontal travel surface 1468 that is at a second height relative to the upper surface of the board 1440 that is higher than the upper edges or top of the board connector 1442.

In this way, the card carrier can be guided along a travel path during its insertion into the enclosure that is over the connectors 1442 and avoids contact with the enclosure, and the length of the surface 1468 is chosen to locate the card connectors in the card carrier over the receiving board connector 1442 (and for passing to the connector 1442 through gap/opening 1469 in the guide 1460). At the end of the second horizontal travel surface 1468 the set of guiding/contact surfaces includes a downward ramp 1470 that guides a received card carrier back to a third height, which may match the height of the first horizontal travel surface 1464, onto a third horizontal travel surface 1472 where the card carrier can travel until its nose reaches the inward edge/end 1474 of the guide 1460 and nose/guide mating surface (or carrier pivot point) 1475.

Figure 15:
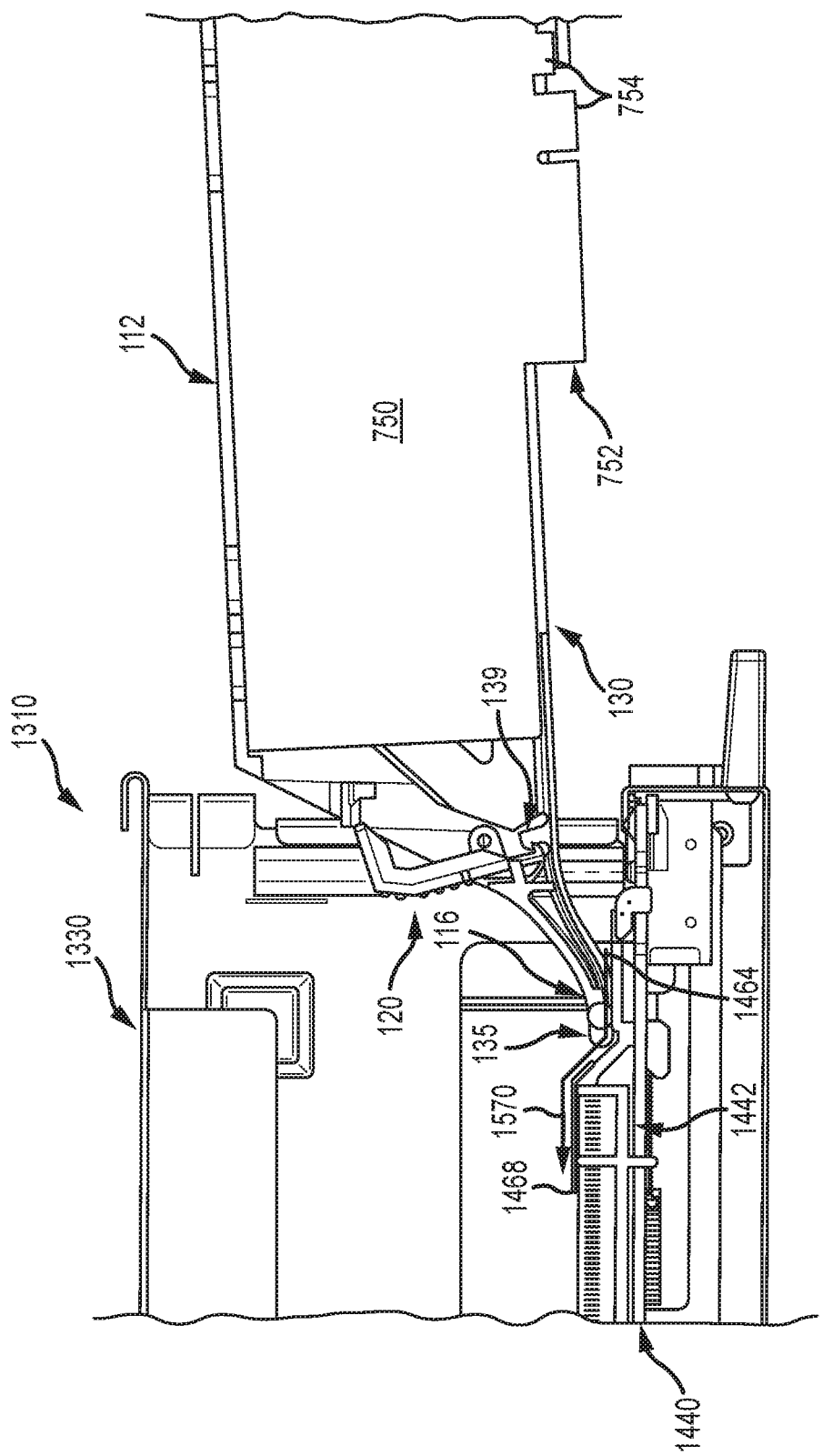
FIG. 15 illustrates a side view of the computer apparatus of FIGS. 13 and 14 with a sidewall removed and during an initial step of installing the card carrier into the enclosure (into the sled with assistance of one of the installed guides on the circuit board)

FIG. 15 illustrates a side view of the computer apparatus 1310 of FIGS. 13 and 14 with a sidewall 1314 removed and during an initial step of installing the card carrier 100 into the enclosure 1320 (into the sled 1330 with assistance of one of the installed guides 1360 on the circuit board 1460). Insertion is carried out to cause the carrier nose (formed with curved halves 117, 135 of top and base members 112, 130) to follow the travel path 1570. Particularly, the nose of the carrier's body/frame 112 is directed by the upward ramp 1462, surface 1464, and upward ramp 1466 up and over the connector 1442 to move along travel surface 1468. In this way, the guide path features pick the carrier 100 up off the board 1440 and guide it into its slot in the sled 1330.

Figure 16:
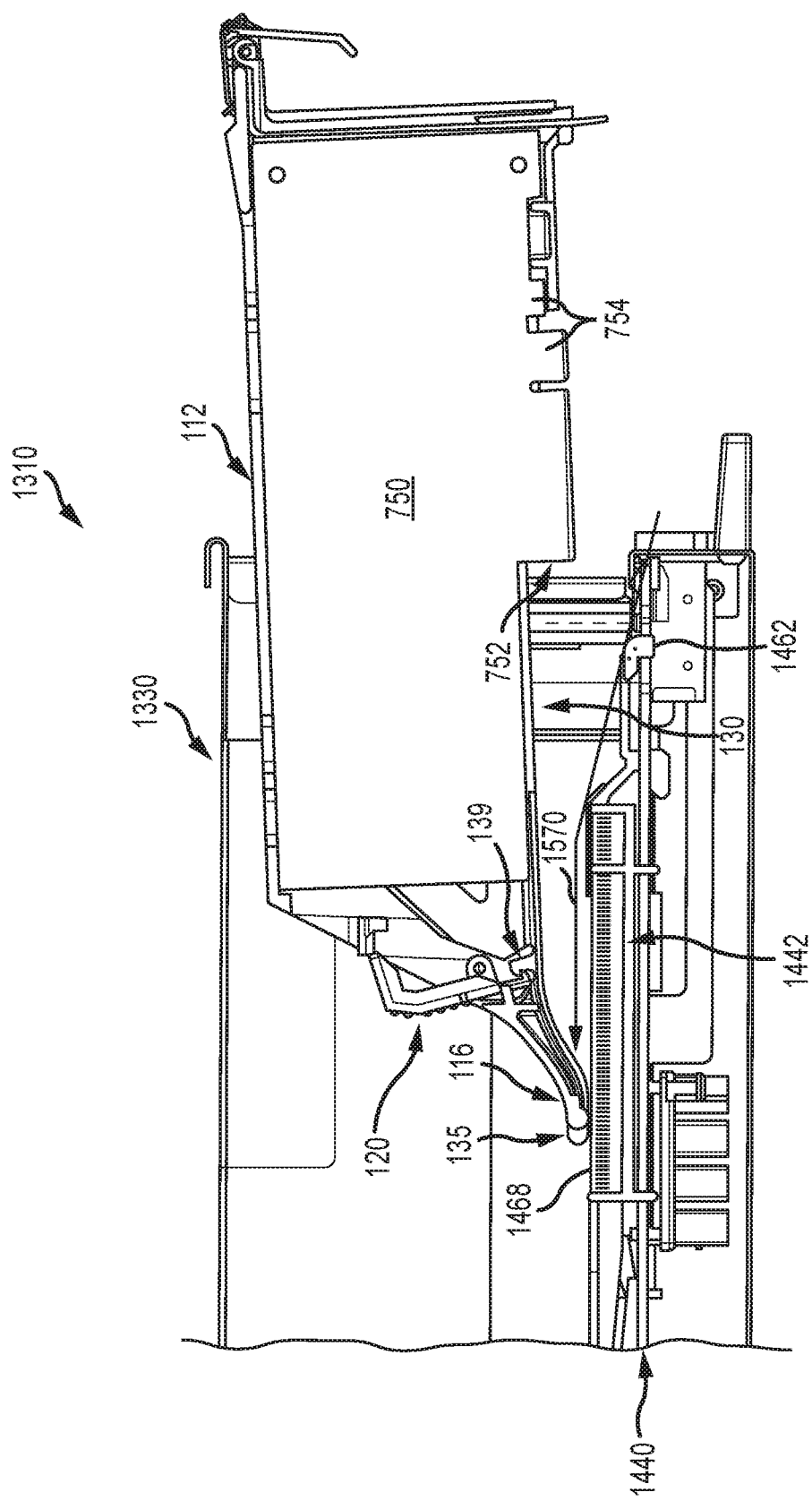
FIG. 16 illustrates the computer apparatus of FIG. 15 at a later or intermediate step of installing the card carrier.

FIG. 16 illustrates the computer apparatus 1310 of FIG. 15 at a later or intermediate step of installing the card carrier 100. Specifically, the nose made up of curved halves 117, 135 of top and base members 112, 130 is shown to be moving along path 1570 so as to ride on surface 1468 over the top of the board's connector 1442. FIG. 17 illustrates the computer apparatus 1310 of FIG. 16 at a yet later or final step of installing the card carrier 100 where the nose of the carrier 100 has traveled all the way until the nose and its halves 117, 135 contacts the end 1474 of the guide 1460 and contact/pivot surface 1475. At this point, the card's connector 752 is over the board's connector 1442, and the card carrier 100 is pivoted downward about the contact/pivot surface 1475 and the carrier's nose to achieve blind mating (or vertical insertion) between the two sets of connectors 752 and 1442. This can be seen in FIG. 18, which illustrates the computer apparatus 1320 of FIG. 17 after (or while) installation of the card carrier is completed as shown with arrow 1890. FIG. 18 shows the completed mating between the card's connector 752 and the receiving connector 1442 of the circuit board 1440 in the enclosure 1320. The card carrier is pushed down manually as shown with arrow 1890 until the card 750 and carrier 100 are fully seated.

Figure 19:
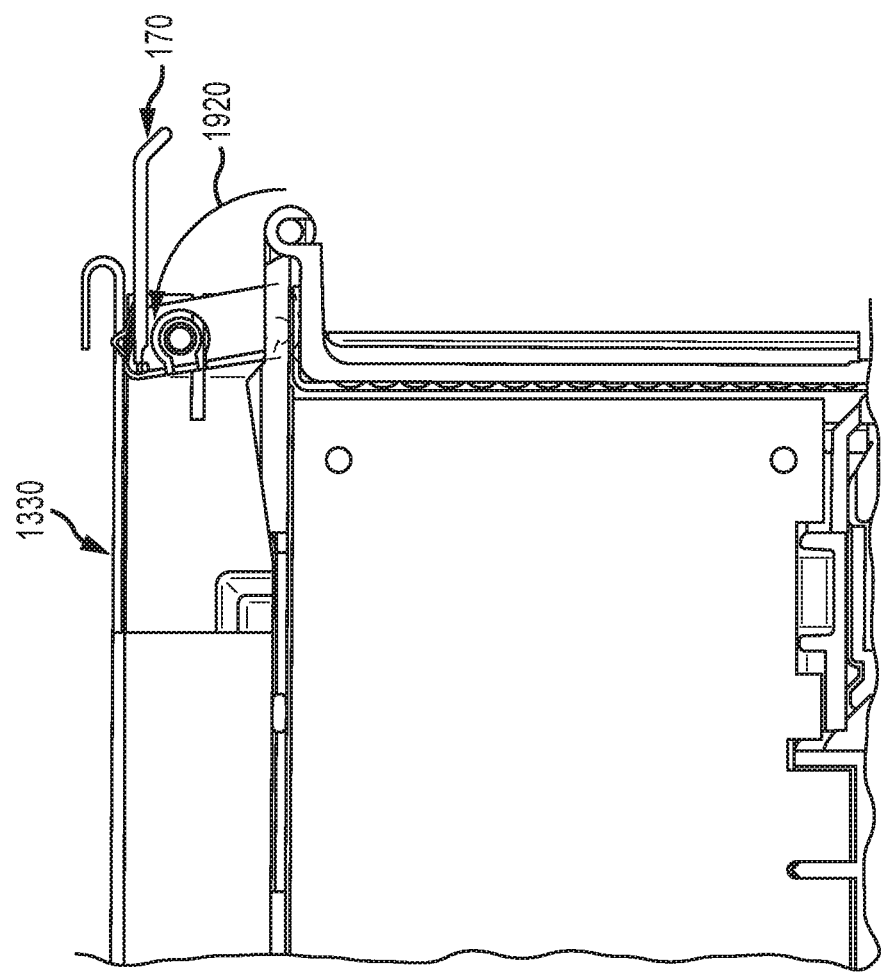
FIG. 19 is a detailed view of a rear portion of the computer apparatus of FIG. 17 showing operations to vertically lock the card carrier within the enclosure.

FIG. 19 is a detailed view of a rear portion of the computer apparatus 1310 of FIG. 17 showing operations (manual manipulation of features of the carrier 100) to vertically lock the card carrier 100 within the enclosure 1320. As shown, the card carrier 100 includes the carrier vertical latch assembly 170, which is pivotally coupled to the cover/roof 116 of the top member 112 of the body/frame 110 of the card carrier 100. This pivotal coupling allows the latch arm to be manipulated to cause the assembly 170 to pivot upward as shown with arrow 1920. In this specific example, the latch assembly 170 is rotated 1920 upward about its pivotal coupling until a detent on the assembly 170 engages a nearby structural element such as a lower surface of the roof of the sled 1330. The engagement of the detent on the latch assembly 170 prevents rotation of the latch assembly 170 (or its latch arm), which locks the card carrier 100 in place within the sled 1330 and within the enclosure 1320.

Figure 20:
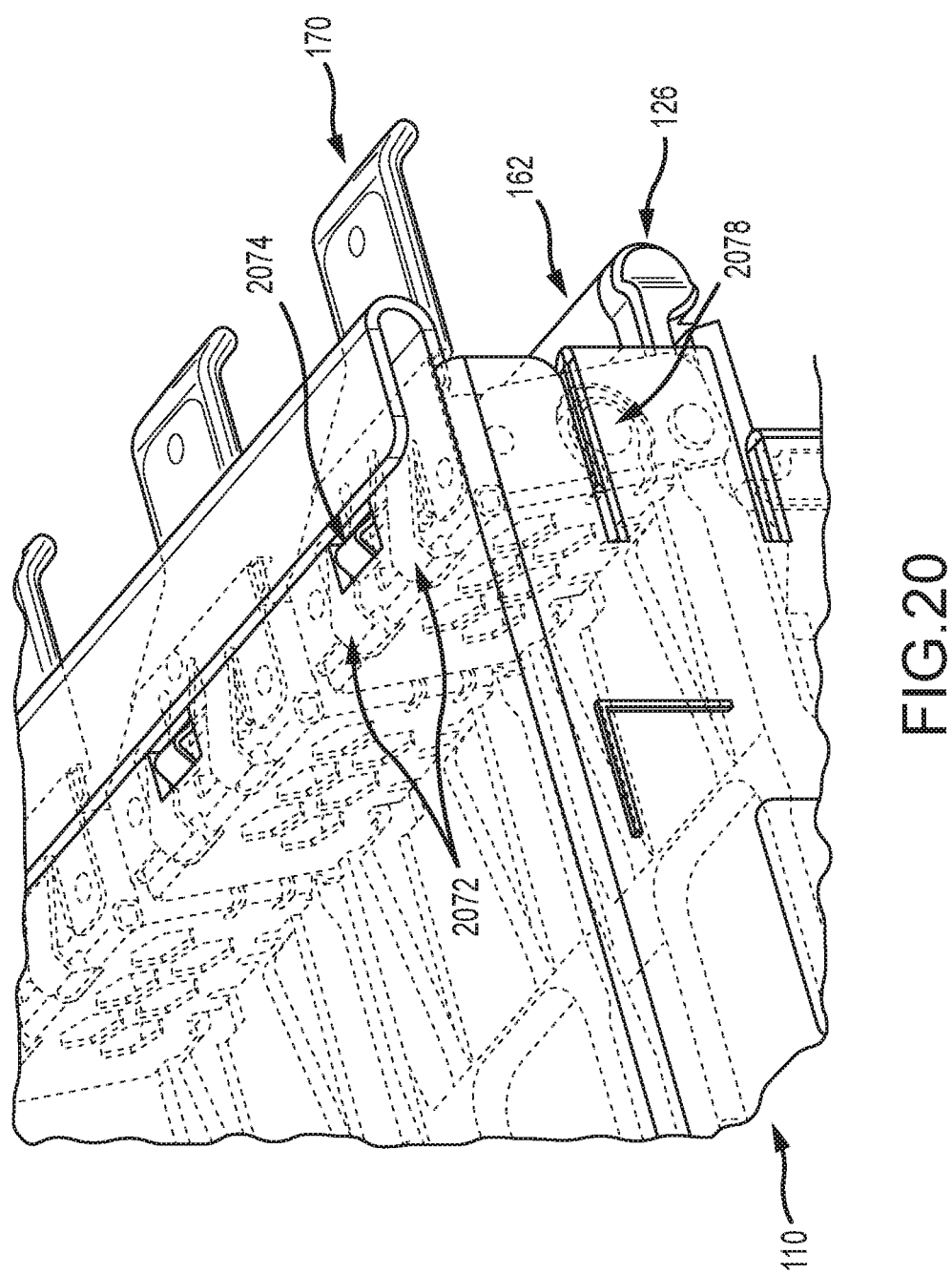
FIG. 20 is another detailed view similar to FIG. 19 showing additional card carrier features with an upper perspective view.

FIG. 20 is another detailed view similar to FIG. 19 showing additional features of the card carrier 100 with an upper perspective view. Particularly, in this illustrated embodiment, the latch assembly 170 includes a latch detent 2074 that protrudes outward from the latch arm to engage an inner/lower surface of the roof/cover of the sled 1330 when the latch assembly 170 is rotated upward into the latched/engaged state or position (shown in FIGS. 19 and 20). A pair of fingers 2072 (which may have a similar design (size and shape) as the latch detent (or finger providing the detent) 2074) are provided on opposite sides of the latch detent 2074 (e.g., the detent 2074 is sandwiched between the fingers 2072). The fingers 2072 are shown to have generally L-shaped bodies and extend outward from the arm of the latch assembly 170 but at a smaller angle than the detent 2074. The fingers 2072 are fabricated (as is the latch detent 2074) of a metal to provide grounding for the card carrier 100, and the fingers 2072 may also be configured to provide preloading of the latch assembly 170.

The latch assembly 170 is shown in FIG. 20 to further include a pair of side-mounted (or positioned) grounding fingers 2078, with one provided on each side of the latch assembly 170 (or set of three latch assemblies 170 shown in FIG. 20) to provide an electrical path between the carrier 100 and the metal sled 1330 when the latch assembly 170 is rotated upward into the engaged/latched position (as shown in FIGS. 19 and 20).

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

We claim:

1. A computing apparatus adapted for rear access installation of a computer card with blind mating, comprising:
   an enclosure with sidewalls defining a rear access opening;
   a circuit board mounted in an interior space of the enclosure to have a horizontal orientation and with an upward facing connector;
   a guide assembly comprising a guide mounted within the interior space, wherein the guide includes a travel surface extending over the upward facing connector of the circuit board; and
   a card carrier comprising a frame housing a computer card, wherein the computer card includes a connector extending outward from the frame of the card carrier and wherein the card carrier rides upon the travel surface when the card carrier is inserted into the interior space via the rear access opening and pivots about a contact surface in the guide assembly when the computer card connector is proximate to the upward facing connector to provide vertical insertion of the computer card in the enclosure and a blind mate between the upward facing connector and the computer card connector.

2. The apparatus of claim 1, wherein the guide further includes a downward ramp adjacent to the travel surface extending over the upward facing connector leading to the contact surface and wherein the guide assembly includes a lead-in nose on an end of the frame of the card carrier that abuts the contact surface during the pivoting of the card carrier about the contact surface.

3. The apparatus of claim 2, wherein the frame of the card carrier includes a bottom contact surface that angles upward away from the lead-in nose or that is arcuate in shape to arch upward away from the lead-in nose.

4. The apparatus of claim 2, wherein the frame is fabricated of plastic and wherein the card carrier further includes a metal shield extending along an end of the frame opposite the nose.

5. The apparatus of claim 4, wherein the card carrier further comprises a latch assembly pivotally coupled to the end of the frame proximate to the metal shield and wherein the latch assembly includes at least one metal grounding member grounding the card carrier via electrical contact with the enclosure when the card carrier is inserted into the interior space of the enclosure.

6. The apparatus of claim 1, wherein the guide is mounted onto the circuit board and wherein the travel surface includes a gap exposing the upward facing connector of the circuit board.

7. The apparatus of claim 1, wherein the frame includes a top member and a base member, wherein the computer card includes at least one mating member extending outward from an edge of the computer card at a location spaced apart from the computer card connector, wherein the computer card is received within an envelope defined between a sidewall of the top member and a sidewall of the base member, and wherein the base member includes a platform extending outward from the sidewall of the base member that includes a slot for receiving the at least one mating member to locate the computer card within the card carrier.

8. The apparatus of claim 7, wherein the top member is pivotally coupled to the base member for pivotal positioning away from the base member in an open state of the card carrier and in contact with the base member in a closed state of the card carrier and wherein the top member includes cover extending from the sidewall of the top member with inner surfaces contacting an edge of the computer card opposite the computer card connector when the card carrier is in the closed state to control vertical movement of the computer card within the card carrier.

9. The apparatus of claim 7, wherein the platform further includes an additional slot for receiving a portion of a bulkhead of the computer card to locate the computer card at a predefined location along a longitudinal axis of the frame.

10. The apparatus of claim 1, wherein the computer card comprises a half length, low profile peripheral component interconnect express (PCIe) card.

11. An apparatus adapted for rear access installation of a computer card, comprising:
  an enclosure;
  a circuit board mounted in an interior space of the enclosure with an upward facing connector;
  a guide mounted within the interior space, wherein the guide is configured to define a travel path extending over the upward facing connector of the circuit board; and
  a card carrier comprising a frame for receiving a computer card, wherein the computer card includes a connector extending outward from the frame of the card carrier when in the frame and wherein the card carrier rides upon the travel surface when the card carrier is inserted into the interior space and pivots about a contact surface in the guide when the frame is further inserted to position the computer card connector vertically above and proximate to the upward facing connector to achieve a blind mate between the upward facing connector and the computer card connector.

12. The apparatus of claim 11, wherein the guide further includes a downward ramp defining a portion of the travel path leading to the contact surface and wherein the guide assembly includes a lead-in nose on an end of the frame of the card carrier that abuts the contact surface when the card carrier is fully inserted into the guide.

13. The apparatus of claim 12, wherein the frame of the card carrier includes a bottom contact surface that angles upward away from the lead-in nose or that is arcuate in shape to arch upward away from the lead-in nose.

14. The apparatus of claim 12, wherein the frame is fabricated of plastic and wherein the card carrier further includes a metal shield extending along an end of the frame opposite the nose.

15. The apparatus of claim 14, wherein the card carrier further comprises a latch assembly pivotally coupled to the end of the frame proximate to the metal shield and wherein the latch assembly includes at least one metal grounding member grounding the card carrier via electrical contact with the enclosure when the card carrier is inserted into the interior space of the enclosure.

16. The apparatus of claim 11, wherein the frame includes a top member and a base member, wherein the computer card includes at least one mating member extending outward from an edge of the computer card at a location spaced apart from the computer card connector, wherein the computer card is received within an envelope defined between a sidewall of the top member and a sidewall of the base member, and wherein the base member includes a platform extending outward from the sidewall of the base member that includes a slot for receiving the at least one mating member to locate the computer card within the card carrier.

17. The apparatus of claim 16, wherein the top member is pivotally coupled to the base member for pivotal positioning away from the base member in an open state of the card carrier and in contact with the base member in a closed state of the card carrier and wherein the top member includes cover extending from the sidewall of the top member with inner surfaces contacting an edge of the computer card opposite the computer card connector when the card carrier is in the closed state to control vertical movement of the computer card within the card carrier.

18. The apparatus of claim 16, wherein the platform further includes an additional slot for receiving a portion of a bulkhead of the computer card to locate the computer card at a predefined location along a longitudinal axis of the frame and wherein the computer card comprises a half length, low profile peripheral component interconnect express (PCIe) card.

19. An apparatus for facilitating rear access vertical insertion of a computer card such as a half length, low profile PCIe card into a computer system enclosure, comprising:
  a guide for mounting on a circuit board within an interior space of an enclosure, wherein the guide is configured to define a travel path extending over an upward facing connector of the circuit board upon which the guide is mounted and terminating at a contact surface; and
  a card carrier comprising a frame for receiving and retaining a computer card such that a connector of the computer card extends outward from the frame of the card carrier,
  wherein the card carrier rides upon the travel surface when the card carrier is inserted into the interior space and pivots about the contact surface in the guide when the frame is further inserted to position the computer card connector vertically above and proximate to the upward facing connector to achieve a blind mate between the upward facing connector and the computer card connector,
  wherein the card carrier includes a lead-in nose on an end of the frame of the card carrier that abuts the contact surface when the card carrier is fully inserted into the guide,
  wherein the frame includes a top member and a base member,
  wherein the computer card includes at least one mating member extending outward from an edge of the computer card at a location spaced apart from the computer card connector, and
  wherein the base member includes a platform extending outward from the sidewall of the base member that includes a slot for receiving the at least one mating member to locate the computer card within the card carrier.

20. The apparatus of claim 19, wherein the frame of the card carrier includes a bottom contact surface that angles upward away from the lead-in nose or that is arcuate in shape to arch upward away from the lead-in nose, wherein the top member is pivotally coupled to the base member for pivotal positioning away from the base member in an open state of the card carrier and in contact with the base member in a closed state of the card carrier and wherein the top member includes cover extending from the sidewall of the top member with inner surfaces contacting an edge of the computer card opposite the computer card connector when the card carrier is in the closed state to control vertical movement of the computer card within the card carrier.

* * * * *